US009411012B2

(12) United States Patent
Hasegawa et al.

(10) Patent No.: US 9,411,012 B2
(45) Date of Patent: Aug. 9, 2016

(54) HANDLER AND PART INSPECTION APPARATUS

(75) Inventors: Nobuo Hasegawa, Azumino (JP); Hiroaki Fujimori, Suwa (JP); Toshioki Shimojima, Suwa (JP)

(73) Assignee: Seiko Epson Corporation (JP)

(*) Notice: Subject to any disclaimer, the term of this patent is extended or adjusted under 35 U.S.C. 154(b) by 213 days.

(21) Appl. No.: 13/603,996

(22) Filed: Sep. 5, 2012

(65) Prior Publication Data
US 2013/0057310 A1    Mar. 7, 2013

(30) Foreign Application Priority Data

Sep. 6, 2011  (JP) .................................. 2011-193666

(51) Int. Cl.
*G01R 31/28* (2006.01)
*H01L 23/00* (2006.01)

(52) U.S. Cl.
CPC ............ *G01R 31/2893* (2013.01); *H01L 24/75* (2013.01); *H01L 2224/75001* (2013.01); *H01L 2224/7565* (2013.01)

(58) Field of Classification Search
CPC .............. H01L 24/75; H01L 24/75001; H01L 24/7565; G01R 31/2867; G01R 31/2863; G01R 31/2865; G01R 31/2893; G01R 31/2887; G01R 31/2808; G01R 31/2851
USPC ................. 324/757.01, 537, 750.19, 750.2, 324/750.21, 750.22; 414/222.09, 222.13, 414/806
See application file for complete search history.

(56) References Cited

U.S. PATENT DOCUMENTS

| 5,184,068 | A | * | 2/1993 | Twigg et al. ............. 324/756.02 |
| 5,650,732 | A | * | 7/1997 | Sakai ....................... 324/757.04 |
| 5,919,024 | A | | 7/1999 | Fujimori |
| 6,036,431 | A | | 3/2000 | Fujimori |
| 6,518,745 | B2 | * | 2/2003 | Kim et al. ................ 324/750.13 |
| RE38,622 | E | | 10/2004 | Fujimori |
| 6,831,454 | B2 | * | 12/2004 | Bae et al. ................. 324/756.02 |
| 7,023,197 | B2 | * | 4/2006 | Jung ........................ 324/757.01 |
| 7,385,385 | B2 | * | 6/2008 | Magliocco ....... G01R 31/31903 324/750.08 |
| 7,464,807 | B2 | * | 12/2008 | Ham et al. .................. 198/468.3 |
| 7,619,432 | B2 | * | 11/2009 | Roberts ...................... 324/750.3 |
| 7,816,937 | B2 | * | 10/2010 | Kwak ................ G01R 31/2893 324/755.07 |
| 7,888,928 | B2 | | 2/2011 | Shiozawa et al. |
| 7,917,327 | B2 | * | 3/2011 | Co ............................ B25J 9/16 221/1 |

(Continued)

FOREIGN PATENT DOCUMENTS

| JP | 10-082830 | 3/1998 |
| JP | 2000-088918 | 3/2000 |

(Continued)

*Primary Examiner* — Tung X Nguyen
*Assistant Examiner* — David Frederiksen
(74) *Attorney, Agent, or Firm* — Harness, Dickey & Pierce, P.L.C.

(57) ABSTRACT

A handler includes a base having an opening portion, a first hand which transports a transport target, a first transport section which transports the first hand to above the opening portion and moves the first hand down, a second hand which transports the transport target, a second transport section which transports the second hand to above the opening portion and moves the second hand down, and a control section which controls an operation of the first transport section and an operation of the second transport section. The handler has a state where the first hand and the second hand are disposed in parallel to the opening portion while being close to each other toward above the opening portion.

6 Claims, 13 Drawing Sheets

(56) References Cited

U.S. PATENT DOCUMENTS

| | | |
|---|---|---|
| 8,008,939 B2 | 8/2011 | Shiozawa et al. |
| 2002/0195313 A1* | 12/2002 | Fujimori ............ G01R 31/2887 198/346.2 |
| 2004/0143411 A1* | 7/2004 | Wu ................................ 702/117 |
| 2005/0151551 A1 | 7/2005 | Okuda et al. |
| 2006/0290369 A1* | 12/2006 | Yamashita et al. ............ 324/765 |
| 2007/0069752 A1* | 3/2007 | Ito ....................... G01R 31/2887 324/750.23 |
| 2008/0074118 A1 | 3/2008 | Masuo |
| 2008/0317575 A1* | 12/2008 | Yamazaki et al. ............. 414/754 |
| 2009/0232626 A1* | 9/2009 | Shiozawa et al. ........ 414/222.09 |
| 2010/0019791 A1* | 1/2010 | Yamashita .................... 324/757 |
| 2010/0147088 A1* | 6/2010 | Ito et al. ...................... 73/864.81 |
| 2010/0310151 A1* | 12/2010 | Kikuchi ............ G01R 31/2893 382/149 |
| 2011/0268538 A1 | 11/2011 | Shiozawa et al. |

FOREIGN PATENT DOCUMENTS

| | | |
|---|---|---|
| JP | 2002-148307 | 5/2002 |
| JP | 2002-156410 | 5/2002 |
| JP | 2002-162438 | 6/2002 |
| JP | 2002-357635 A | 12/2002 |
| JP | 2003-177157 | 6/2003 |
| JP | 2004-053610 | 2/2004 |
| JP | 2009-192324 | 8/2009 |
| JP | 2009-198375 | 9/2009 |
| JP | 2009-216592 | 9/2009 |
| JP | 2010-054521 | 3/2010 |
| KP | 20070121022 | 12/2007 |
| TW | 200409929 | 6/2004 |
| TW | 200911653 A | 3/2009 |
| WO | WO-2008-142752 A1 | 11/2008 |

* cited by examiner

HANDLER AND PART INSPECTION APPARATUS

BACKGROUND

1. Technical Field

The present invention relates to a handler which transports a transport target and a part inspection apparatus including the handler, and more particularly, to a handler which transports a transport target to an opening portion formed in a base and a part inspection apparatus including the handler.

2. Related Art

In the related art, a part inspection apparatus has been proposed which inspects electric characteristics of an electronic part such as a semiconductor chip. Such a part inspection apparatus includes a tester which is provided with an inspection socket where the electronic part is mounted, and a handler where the tester is mounted and which transports the electronic part before inspection to the tester, for example.

Such a handler includes a transport section having a hand which holds a plurality of electronic parts accommodated in a supply tray by vacuum suction. The transport section moves the hand which holds the electronic part up to above the inspection socket, and then moves the hand down toward the inspection socket to press the electronic part into the inspection socket. Thus, a terminal of the inspection socket and a terminal of the electronic part are electrically connected to each other, to thereby inspect electric characteristics of the electronic part. After the inspection of the electronic part ends, the transport section moves the hand to detach the electronic part after inspection which is held by the hand from the inspection socket, and then moves the hand up to a recovery tray to discharge the electronic part which is held by the hand to the recovery tray. Then, the transport section adsorbs a new electronic part accommodated in the supply tray by the hand, and again, moves the hand toward the inspection socket.

In this regard, in order to efficiently perform the inspection of the electronic part, it is preferable that the time from the electronic part after inspection is detached from the inspection socket until the next electronic part is disposed in the inspection socket be short. In this regard, JP-A-2002-148307 discloses the following handler to shorten such a time.

That is, the handler disclosed in JP-A-2002-148307 includes a pair of transport sections which is independently controlled, and inspections of electronic parts transported by the pair of transport sections are alternately performed in a common inspection socket. While the inspection of the electronic part held by a hand of one transport section is performed, the other transport section discharges the electronic part after inspection from the hand, holds a new electronic part before inspection by the hand, and waits in the vicinity of the inspection socket. According to such a configuration, immediately after the electronic part held by the hand of one transport section is detached from the inspection socket, the electronic part held by the hand of the other transport section is disposed in the inspection socket. Thus, it is possible to efficiently perform the inspection of the electronic part.

In recent years, in order to enhance inspection efficiency of an electronic part, the number of electronic parts inserted in an inspection socket in one-time inspection has been increased. However, if the number of electronic parts inserted by a hand is increased, the size and weight of the hand become large and heavy, and thus, it is difficult to avoid decrease in the transport speed of the electronic part and increase in the transport distance of the electronic part. Thus, in the above-described handler, although it is possible to increase the number of electronic parts inserted in the inspection socket by increasing the size of the hand, there is still a room for improvement to suppress decrease in transport efficiency due to decrease in the transport speed or increase in the transport distance caused by the increasing size of the hand.

SUMMARY

An advantage of some aspects of the invention is to provide a handler and a part inspection apparatus which are able to increase the number of transport targets disposed in an opening portion formed in a base and to efficiently transport a plurality of transport targets while maintaining the number of the transport targets capable of being held by a hand.

An aspect of the invention is directed to a handler including: a base having an opening portion; a first transport section which includes a first hand which holds a transport target, and moves the first hand up to a position which faces the opening portion and then moves the first hand toward the opening portion; a second transport section which includes a second hand which holds the transport target, and moves the second hand up to a position which faces the opening portion and then moves the second hand toward the opening portion; and a control section which controls an operation of the first transport section and an operation of the second transport section, wherein the handler has a state where the first hand and the second hand move from a position where the first hand and the second hand are spaced from each other to a position where the first hand and the second hand face the opening portion in different directions and then move toward the opening portion so that the first hand and the second hand are adjacently disposed in the opening portion.

Another aspect of the invention is directed to a part inspection apparatus including a tester which inspects an electronic part and a handler where the tester is mounted and which presses the electronic part against an inspection socket of the tester, wherein the handler includes: a base having an opening portion through which the inspection socket is exposed; a first transport section which includes a first hand which holds a transport target, and moves the first hand up to a position which faces the opening portion and then moves the first hand toward the opening portion; a second transport section which includes a second hand which holds the transport target, and moves the second hand up to a position which faces the opening portion and then moves the second hand toward the opening portion; and a control section which controls an operation of the first transport section and an operation of the second transport section, wherein the handler has a state where the first hand and the second hand move from a position where the first hand and the second hand are spaced from each other to a position where the first hand and the second hand face the opening portion in different directions and then move toward the opening portion so that the first hand and the second hand are adjacently disposed in the opening portion.

According to the aspects of the invention, the handler has a state where the first hand and the second hand move to be close to each other toward the position where the first hand and the second hand face the opening portion and then move toward the opening portion to be disposed in parallel to the opening portion. Thus, compared with a case where the transport target is transported to the opening portion by only the first hand or a case where the transport target is transported to the opening portion by only the second hand, it is possible to increase the number of transport targets transported to the opening portion while maintaining the number of transport targets capable of being held by the hand. That is, without increasing the size of the hand, it is possible to increase the number of transport targets transported to the opening portion. Thus, it is possible to suppress decrease in the transport speed or increase in the transport distance due to the increasing size of the hand, and thus, it is possible to efficiently transport a plurality of transport targets while increasing the number of transport targets transported to the opening portion which is a transport destination.

In one aspect of the invention, the first transport section moves the first hand between a first position where the first hand is disposed in the opening portion and a first delivery position where holding and discharge of the transport target by the first hand are performed, the second transport section moves the second hand between a second position where the second hand is disposed in the opening portion and a second delivery position where holding and discharge of the transport target by the second hand are performed, and the handler has a state where the first hand disposed at the first position and the second hand disposed at the second position move to detach from the opening portion and then move toward the respective delivery positions in different directions.

According to this configuration, since the first hand and the second hand move to be spaced from each other from the position where the first hand and the second hand face the opening portion, the timing when the first hand moves while holding a subsequent transport target and the timing when the second hand moves while holding a subsequent transport target are easily overlapped. As a result, the first hand which moves to the opening portion by the first transport section and the second hand which moves to the opening portion by the second transport section easily become adjacent to each other again in the opening portion. Thus, the above-described effect becomes more remarkable.

In one aspect of the invention, the handler further includes: a first shuttle in which a first supply tray which supplies the transport target to be held by the first hand to the first hand and a first recovery tray which recovers, from the first hand, the transport target discharged from the first hand are independently installed; and a second shuttle in which a second supply tray which supplies the transport target to be held by the second hand to the second hand and a second recovery tray which recovers, from the second hand, the transport target held by the second hand are independently installed, and the control section controls an operation of the first shuttle and an operation of the second shuttle, and switches a tray disposed at the first delivery position alternately between the first supply tray and the first recovery tray and switches a tray disposed at the second delivery position alternately between the second supply tray and the second recovery tray.

Here, in a case where the supply tray and the recovery tray are common, during the time after the hand discharges the transport target held by the hand until the hand holds the next transport target, the recovery of the transport target discharged from the hand from the tray and the supply of the next transport target to the tray are sequentially performed. That is, the hand should wait until the next transport target is supplied to the tray, which may noticeably decrease transport efficiency of the transport target.

In this regard, according to the configuration described above, the tray disposed at each delivery position is switched alternately between the supply tray and the recovery tray. Thus, during the period when the hand which is supplied with the transport target from the supply tray at the delivery position returns to the delivery position again, it is possible to switch the tray disposed at the delivery position from the supply tray to the recovery tray. Further, during the period when the recovery tray is disposed at the delivery position, it is possible to supply the next transport target to the supply tray.

Then, if the transport target is discharged from the hand with respect to the recovery tray disposed at the delivery position, the tray disposed at the delivery position, which is to supply a new transport target to the hand, is switched to the supply tray. During the period when the supply tray is disposed at the delivery position, it is possible to recover the transport target discharged in the recovery tray.

That is, according to the configuration described above, the supply of the transport target to the supply tray and the recovery of the transport target from the recovery tray can be performed during the time when each hand moves. As a result, compared with a case where the supply tray and the recovery tray are common, it is possible to shorten the waiting time during holding and discharge of the transport target. Thus, the supply and recovery of the transport target by the hand are smoothly performed.

In one aspect of the invention, the handler has a state where the first supply tray is disposed at the first delivery position and the second supply tray is disposed at the second delivery position.

According to this configuration, since the first supply tray is disposed at the first delivery position and the second supply tray is disposed at the second delivery position, it is possible to supply the transport target to the second hand when the transport target is supplied to the first hand. Thus, before the first hand and the second hand move close to each other toward the position where the first hand and the second hand face the opening portion, it is possible to shorten the period when one hand waits until the transport target is completely supplied to the other hand.

In one aspect of the invention, the handler has a state where the first recovery tray is disposed at the first delivery position and the second recovery tray is disposed at the second delivery position.

According to this configuration, since the first recovery tray is disposed at the first delivery position and the second recovery tray is disposed at the second delivery position, it is possible to recover the transport target held by the second hand when the transport target held by the first hand is recovered. Thus, after the first hand and the second hand move away from each other from the position where the first hand and the second hand face the opening portion, it is possible to shorten the period when one hand waits until the transport target is completely recovered from the other hand.

In one aspect of the invention, the control section controls the operation of the first shuttle and the operation of the second shuttle so that the disposition of the first supply tray to the first delivery position and the disposition of the second supply tray to the second delivery position are performed at the same timing, and controls the operation of the first shuttle and the operation of the second shuttle so that the disposition of the first recovery tray to the first delivery position and the disposition of the second supply tray to the second delivery position are performed at the same timing.

According to this configuration, since the first shuttle and the second shuttle perform the same operation, it is possible to more effectively shorten the period when one hand waits until the transport target is completely supplied to the other hand. Further, it is possible to more effectively shorten the period when one hand waits until the transport target is completely recovered from the other hand.

In one aspect of the invention, the control section controls the operation of the first transport section and the operation of the second transport section so that the holding of the transport target by the first hand and the holding of the transport target by the second hand are performed at the same timing, and controls the operation of the first transport section and the operation of the second transport section so that the discharge of the transport target by the first hand and the holding of the transport target by the second hand are performed at the same timing.

According to this configuration, since the first transport section and the second transport section perform the same operation, it is possible to more effectively shorten the period when one hand waits until the transport target is completely supplied to the other hand. Further, it is possible to more effectively shorten the period when one hand waits until the transport target is completely recovered from the other hand.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment in which a handler according to the invention is embodied will be described with reference to FIG. 1 to FIGS. 14A to 14D. Firstly, a configuration of a part inspection apparatus in which the handler is used will be described with reference to FIGS. 1 and 2.

Configuration of Part Inspection Apparatus

Figure 1:
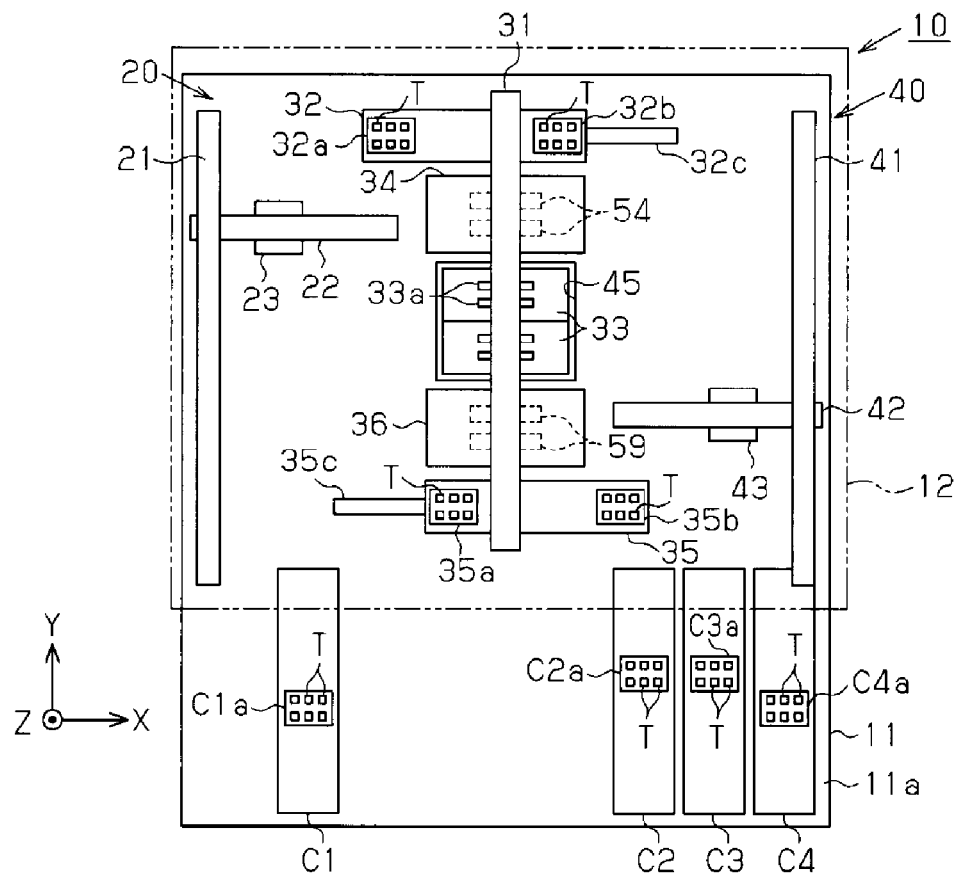
FIG. 1 is a view illustrating the entire configuration of a part inspection apparatus which is mounted with a handler according to an embodiment of the invention.

As shown in FIG. 1, on a base 11 of a handler 10, a mounting surface 11a on which various robots are mounted is provided as an upper surface, and most of the mounting surface 11a is covered by a cover member 12. A transport space which is a space surrounded by the cover member 12 and the mounting surface 11a has a temperature and a humidity which are maintained at predetermined values by dry air supplied from the outside of the part inspection apparatus.

On the mounting surface 11a of the base 11, four conveyors which extend in one direction are arranged in a direction orthogonal to a transport direction of the conveyors. Among four conveyors, one supply conveyor C1 is installed on one side in the X direction which is the array direction of the conveyors, and three recovery conveyors C2, C3 and C4 are installed on the other side in the X direction. Further, in the supply conveyor C1, a supply conveyor tray C1a moves toward the inside from the outside of the cover member 12. Further, in the recovery conveyors C2, C3 and C4, recovery conveyor trays C2a, C3a and C4a move toward the outside from the inside of the cover member 12. A plurality of electronic parts T which are transport targets are accommodated in the supply conveyor tray C1a, and a plurality of electronic parts T after inspection are accommodated in the recovery conveyor trays C2a, C3a and C4a. The plurality of electronic parts T are accommodated in the X direction and the Y direction in a matrix form, in the supply conveyor tray C1a and the recovery conveyor trays C2a, C3a and C4a according to the present embodiment.

A supply robot 20 and a recovery robot 40 which face each other in the X direction are mounted on the mounting surface 11a of the base 11. The supply robot 20 is disposed on the side of the supply conveyor C1 in the Y direction, and the recovery robot 40 is disposed on the side of the recovery conveyors C2, C3 and C4 in the Y direction.

The supply robot 20 includes a fixed supply guide 21 which is a fixed shaft which extends in the Y direction, a movable supply guide 22 which is a movable shaft which is connected to the fixed supply guide 21, and a supply hand unit 23 which is connected to the movable supply guide 22 and moves along the movable supply guide 22.

The movable supply guide 22 is a movable shaft which extends to the side of the recovery robot 40 from the fixed supply guide 21, and is connected to the fixed supply guide 21 to be able to reciprocate in the Y direction. The supply hand unit 23 is an end effector which is disposed on the side of the mounting surface 11a of the movable supply guide 22, and is connected to the movable supply guide 22 to be able to reciprocate in the X direction. Further, the supply hand unit 23 is connected to the movable supply guide 22 to be able to descend from the movable supply guide 22 to the mounting surface 11a and to ascend from the side of the mounting surface 11a to the movable supply guide 22.

Further, the movable supply guide 22 moves to the side of the supply conveyor C1 along the fixed supply guide 21, and the supply hand unit 23 moves to above the supply conveyor tray C1a along the movable supply guide 22. Accordingly, the electronic parts T which are mounted on the supply conveyor tray C1a are adhered to a suction pad of the supply hand unit 23, and then are lifted from the supply conveyor tray. Further, as the movable supply guide 22 moves away from above the supply conveyor C1 along the fixed supply guide 21 from this state, the electronic parts T adhered to the supply hand unit 23 are supplied to a predetermined position in the above-mentioned transport space. The supply hand unit 23 in the present embodiment suctions and holds a plurality of electronic parts at the same time.

The recovery robot 40 includes a fixed recovery guide 41 which is a fixed shaft which extends in the Y direction, a movable recovery guide 42 which is a movable shaft connected to the fixed recovery guide 41, and a recovery hand unit 43 which is connected to the movable recovery guide 42 and moves along the movable recovery guide 42 in the X direction, in a similar way to the supply robot 20.

The movable recovery guide 42 is a movable shaft which extends to the side of the supply robot 20 from the fixed recovery guide 41, and is connected to the fixed recovery guide 41 to be able to reciprocate in the Y direction. The recovery hand unit 43 is an end effector which is disposed on the side of the mounting surface 11a of the movable recovery guide 42, and is connected to the movable recovery guide 42 to be able to reciprocate in the X direction. Further, the recovery hand unit 43 is connected to the movable recovery guide 42 to be able to descend from the movable recovery guide 42 to the mounting surface 11a and to ascend from the side of the mounting surface 11a to the movable recovery guide 42.

Further, the movable recovery guide 42 moves to the side of the recovery conveyors C2, C3 and C4 along the fixed recovery guide 41, and the recovery hand unit 43 moves to above the recovery conveyor trays C2a, C3a and C4a along the movable recovery guide 42. Accordingly, the electronic parts T which are adhered to a suction pad of the recovery hand unit 43 are mounted onto the recovery conveyor trays C2a, C3a and C4a. The recovery hand unit 43 in the present embodiment suctions and holds a plurality of electronic parts at the same time, in a similar way to the supply hand unit 23.

Further, on the inside surface of the cover member 12, a transport guide 31 which extends in the Y direction is fixed at the approximate center of the inside surface in the X direction. A first shuttle 32 which extends in the X direction and a second shuttle 35 which extends in the X direction are disposed under the opposite end portions of the transport guide 31.

The first shuttle 32 is connected to a first shuttle guide 32c which extends in the X direction and is fixed on the mounting surface 11a and reciprocates along the X direction. A supply shuttle tray 32a which is a first supply tray is fixed on the side of the supply robot 20 in the first shuttle 32, and a recovery shuttle tray 32b which is a first recovery tray is fixed on the side of the recovery robot 40 in the first shuttle 32. A plurality of electronic parts T before inspection which are transport targets are accommodated in the supply shuttle tray 32a, and a plurality of electronic parts T after inspection are accommodated in the recovery shuttle tray 32b.

Further, the first shuttle 32 is disposed at a supply position which is a position where the supply shuttle tray 32a is disposed under the movable supply guide 22 and the recovery shuttle tray 32b is disposed under the transport guide 31. Further, the first shuttle 32 is also disposed at a recovery position which is a position where the supply shuttle tray 32a is disposed under the transport guide 31 and the recovery shuttle tray 32b is disposed under the movable recovery guide 42. Further, the first shuttle 32 reciprocates along the X direction between the supply position and the recovery position. That is, the first shuttle 32 reciprocates between the supply position where the electronic parts T may be supplied to the supply shuttle tray 32a by the supply hand unit 23 and the recovery position where the electronic parts may be recovered from the recovery shuttle tray 32b by the recovery hand unit 43.

Further, the second shuttle 35 is connected to a second shuttle guide 35c which extends in the X direction and is fixed on the mounting surface 11a and reciprocates along the X direction. A supply shuttle tray 35a which is a second supply tray is fixed on the side of the supply robot 20 in the second shuttle 35, and a recovery shuttle tray 35b which is a second recovery tray is fixed on the side of the recovery robot 40 in the second shuttle 35. A plurality of electronic parts T before inspection which are transport targets are accommodated in the supply shuttle tray 35a, and a plurality of electronic parts T after inspection are accommodated in the recovery shuttle tray 35b.

Further, the second shuttle 35 is disposed at a supply position which is a position where the supply shuttle tray 35a is disposed under the movable supply guide 22 and the recovery shuttle tray 35b is disposed under the transport guide 31. Further, the second shuttle 35 is also disposed at a recovery position which is a position where the supply shuttle tray 35a is disposed under the transport guide 31 and the recovery shuttle tray 35b is disposed under the movable recovery guide 42. Further, the second shuttle 35 reciprocates along the X direction between the supply position and the recovery position. That is, the second shuttle 35 reciprocates between the supply position where the electronic parts T may be supplied to the supply shuttle tray 35a by the supply hand unit 23 and the recovery position where the electronic part T may be recovered from the recovery shuttle tray 35b by the recovery hand unit 43.

Further, on the supply shuttle trays 32a and 35a and the recovery shuttle trays 32b and 35b in the present embodiment, the plurality of electronic parts T are accommodated in the X direction and the Y direction in a matrix form. That is, the supply shuttle trays 32a and 35a respectively receive the supply of the electronic parts T two times by the supply hand unit 23 to be fully mounted with the electronic parts T. Further, the recovery shuttle trays 32b and 35b respectively receive the recovery of the electronic parts T two times by the recovery hand unit 43 to recover all the electronic parts T.

Further, at the approximate center of the transport space on the mounting surface 11a, a rectangular opening portion 45 is formed through the mounting surface 11a. A test head 33 of a tester which is a device different from the handler 10 is installed in the opening portion 45. The test head 33 is a socket in which the electronic part T is inserted, and is electrically connected to an inspection circuit for inspection of the electronic part T.

Inspection pockets 33a capable of simultaneously accommodating the plurality of electronic parts T are concavely installed on the upper surface of the test head 33, and a plurality of female terminals capable of fitting to male terminals of the electronic parts T are installed on lower surfaces of the inspection pockets 33a. Further, as the male terminals included in the electronic parts T fit to the female terminals of the inspection pockets 33a, it is possible to inspect electric characteristics of the electronic parts T by the tester. The tester receives an electric signal indicating inspection starting from the handler 10 to start inspection of the electronic parts T, and then outputs the inspection result to the handler 10.

Further, a first transport unit 34 and a second transport unit 36 are connected in parallel to the transport guide 31 in the Y direction.

Figure 2:
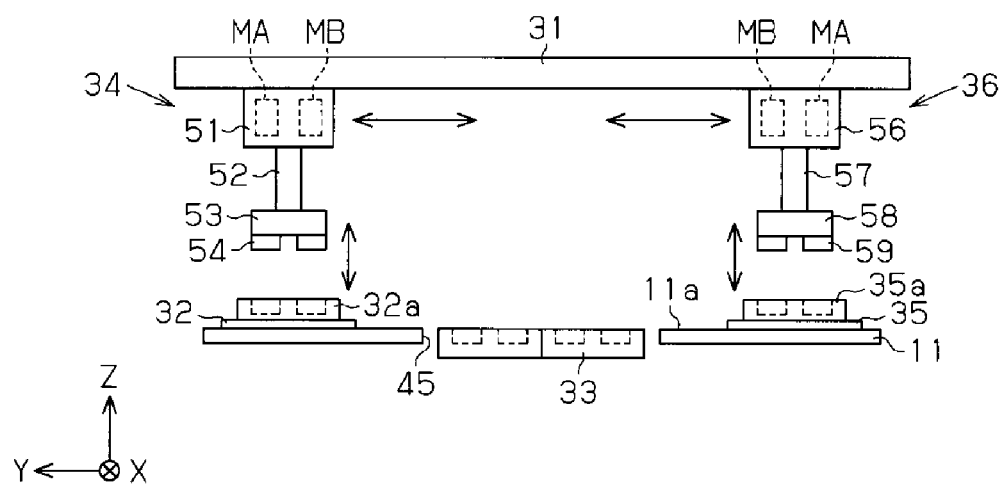
FIG. 2 is an end view schematically illustrating an end section structure of the handler according to the embodiment.

As shown in FIG. 2, a horizontal movement arm 51 which forms the first transport unit 34 is connected to be able to reciprocate along the transport guide 31. As a built-in transport motor MA rotates forward or reversely, the horizontal movement arm 51 reciprocates along the transport guide 31. A vertical movement arm 52 capable of ascending or descending with respect to the horizontal movement arm 51 is connected to a lower end portion of the horizontal movement arm 51. As a pressing motor MB which is built in the horizontal movement arm 51 rotates forward or reversely, the vertical movement arm 52 ascends or descends with respect to the horizontal movement arm 51.

Further, a first hand 53 which includes a plurality of adsorbing sections 54 which are end effectors capable of adsorbing the electronic parts T by vacuum suction, for example, is connected to a lower end portion of the vertical movement arm 52. The adsorbing sections 54 are configured by nozzles, a suction pump connected to the nozzles, leak valves which supply compressed air to the nozzles, and the like, for example. Further, a first transport section is configured by the transport guide 31, the horizontal movement arm 51, the transport motor MA, the vertical movement arm 52, the pressing motor MB and the first hand 53.

That is, the first transport unit 34 includes a state where the first hand 53 faces the first shuttle 32 and a state where the first hand 53 faces the opening portion 45. Further, the first transport unit 34 moves the first hand 53 up and down in the Z direction between the transport guide 31 and the mounting surface 11a.

Further, the first transport unit 34 holds the electronic parts T before inspection accommodated in the supply shuttle tray 32a of the first shuttle 32 by the first hand 53, and transports the electronic parts T from above the first shuttle 32 which is a transport destination to above the test head 33. Further, the first transport unit 34 holds the electronic parts T after inspection in the test head 33 by the first hand 53, and returns the first hand 53 to above the first shuttle 32 which is the transport destination. Further, the first transport unit 34 transports the electronic parts T held by the first hand 53 to the recovery shuttle tray 32b of the first shuttle 32.

In the present embodiment, in a state where the first hand 53 is disposed at a first inspection position in a range where the first hand 53 moves, the electronic parts T are inserted into the test head 33. Further, in a state where the first hand 53 is disposed at a first delivery position in the range where the first hand 53 moves, delivery of the electronic parts T is performed in a certain tray in the first shuttle 32.

As shown in FIG. 2, a horizontal movement arm 56 which forms the second transport unit 36 is connected to be able to reciprocate along the transport guide 31. As a built-in transport motor MA rotates forward or reversely, the horizontal movement arm 56 reciprocates along the transport guide 31. A vertical movement arm 57 capable of ascending or descending with respect to the horizontal movement arm 56 is connected to a lower end portion of the horizontal movement arm 56. As a pressing motor MB which is built in the horizontal movement arm 51 rotates forward or reversely, the vertical movement arm 57 ascends or descends with respect to the horizontal movement arm 51.

Further, a secondhand 58 which includes a plurality of adsorbing sections 59 which are end effectors capable of adsorbing the electronic parts T by vacuum suction, for example, is connected to a lower end portion of the vertical movement arm 57. The adsorbing sections 59 are configured by suction nozzles, a suction pump connected to the nozzles, leak valves which supply compressed air to the nozzles, and the like, for example. Further, a second transport section is configured by the transport guide 31, the horizontal movement arm 56, the transport motor MA, the vertical movement arm 57, the pressing motor MB and the second hand 58.

That is, the second transport unit 36 includes a state where the second hand 58 faces the second shuttle 35 and a state where the second hand 58 faces the opening portion 45. Further, the second transport unit 36 moves the second hand 58 up and down in the Z direction between the transport guide 31 and the mounting surface 11a.

Further, the second transport unit 36 holds the electronic parts T before inspection accommodated in the supply shuttle tray 35a of the second shuttle 35 by the second hand 58, and transports the electronic parts T from above the second shuttle 35 which is a transport destination to above the test head 33. Further, the second transport unit 36 holds the electronic parts T after inspection in the test head 33 by the second hand 58, and returns the second hand 58 to above the second shuttle 35 which is the transport destination. Further, the second transport unit 36 transports the electronic parts T held by the second hand 58 to the recovery shuttle tray 35b of the second shuttle 35.

In the present embodiment, in a state where the second hand 58 is disposed at a second inspection position in a range where the second hand 58 moves, the electronic parts T are inserted into the test head 33. Further, in a state where the second hand 58 is disposed at a second delivery position in the range where the second hand 58 moves, delivery of the electronic parts T is performed in a certain tray in the second shuttle 35.

Further, the opening portion 45 of the handler 10 is formed so that the first hand 53 and the second hand 58 are inserted in parallel in the Y direction. That is, the opening portion 45 has such a size that the electronic parts T held by the first hand 53 and the electronic parts T held by the second hand 58 are arranged in parallel in the Y direction and are able to be mounted on the test head 33.

Electric Configuration of Handler 10

Figure 3:
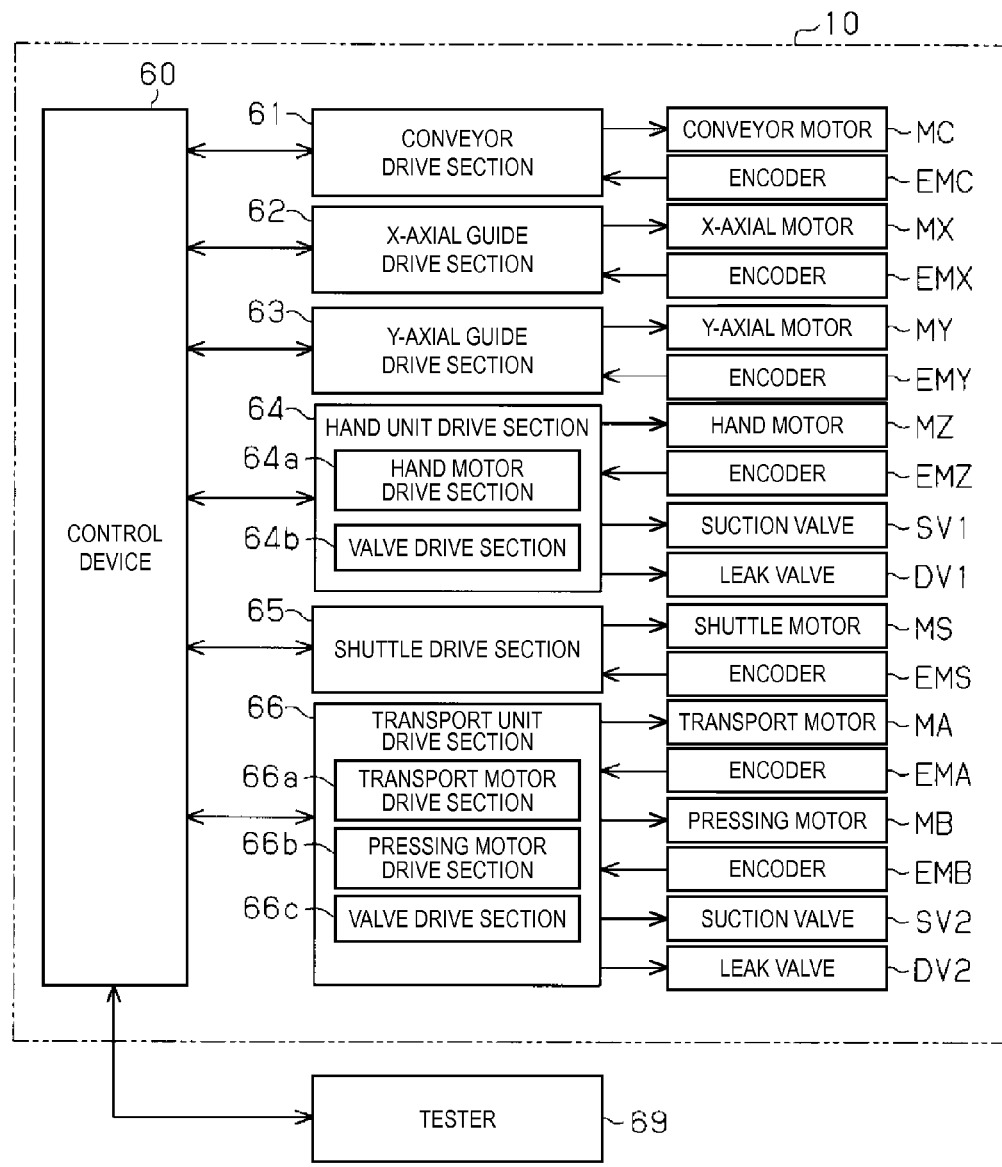
FIG. 3 is a block diagram illustrating an electric configuration of the handler according to the embodiment.

With respect to an electric configuration of the part inspection apparatus, an electric configuration of the handler 10 will be mainly described with reference to FIG. 3. A control device 60 which forms a control section provided in the handler 10 is mainly configured by a microcomputer which includes a central processing unit (CPU), a non-volatile memory (ROM), and a volatile memory (RAM). The control device 60 performs a variety of controls relating to operations of the handler 10 on the basis of various data and programs stored in the ROM and the RAM.

A conveyor drive section 61 which drives a conveyor motor MC to rotate is electrically connected to the control device 60. An encoder EMC which detects the rotation position of the conveyor motor MC is connected to the conveyor drive section 61. The conveyor drive section 61 generates a driving current of the conveyor motor MC on the basis of a position command input from the control device 60 and the rotation position of the conveyor motor MC input from the encoder EMC, and outputs the driving current to the conveyor motor MC. The conveyor motor MC rotates according to the driving current, to drive the conveyors C1 to C4. The conveyor drive section 61 and the conveyor motor MC are installed to each of the conveyors C1 to C4, and the encoder EMC is installed to each conveyor motor MC. That is, the control device 60 controls the operations of the respective conveyors C1 to C4 in an independent manner.

Further, an X-axial guide drive section 62 which drives an X-axial motor MX to rotate is electrically connected to the control device 60. An encoder EMX which detects the rotation position of the X-axial motor MX is connected to the X-axial guide drive section 62. The X-axial guide drive section 62 generates a driving current of the X-axial motor MX on the basis of a position command input from the control device 60 and the rotation position input from the encoder EMX, and outputs the driving current to the X-axial motor MX. The X-axial motor MX rotates according to the input driving current, to reciprocate the hand units 23 and 43 along the movable guides 22 and 42. The X-axial guide drive section 62 and the X-axial motor MX are installed to each of the supply hand unit 23 and the recovery hand unit 43, respectively, and the encoder EMX is installed to each X-axial motor MX.

A Y-axial guide drive section 63 which drives a Y-axial motor MY to rotate is electrically connected to the control device 60. An encoder EMY which detects the rotation position of the Y-axial motor MY is connected to the Y-axial guide drive section 63. The Y-axial guide drive section 63 generates a driving current of the Y-axial motor MY on the basis of a position command input from the control device 60 and the rotation position input from the encoder EMY, and outputs the driving current to the Y-axial motor MY. The Y-axial motor MY rotates according to the input driving current, to reciprocate the movable guides 22 and 42 along the fixed guides 21 and 41. The Y-axial guide drive section 63 and the Y-axial motor MY are installed to each of the movable supply guide 22 and the movable recovery guide 42, respectively, and the encoder EMY is installed to each Y-axial motor MY.

A hand unit drive section 64 which includes a hand motor drive section 64a and a valve drive section 64b is connected to the control device 60. Here, an encoder EMZ which detects the rotation position of a hand motor MZ is connected to the hand motor drive section 64a. The hand motor drive section 64a generates a driving current of the hand motor MZ on the basis of a position command input from the control device 60 and the rotation position input from the encoder EMZ, and outputs the driving current to the hand motor MZ. The hand motor MZ rotates according to the input driving current, to move the hand units 23 and 43 up and down.

A suction valve SV1 and a leak valve DV1 which are installed at the tip ends of the hand units 23 and 43 are connected to the valve drive section 64b. The valve drive section 64b generates a driving signal of the suction valve SV1 on the basis of an opening/closing command of the suction valve SV1 input from the control device 60, and outputs the driving signal to the suction valve SV1. The suction valve SV1 performs an opening/closing operation according to the input driving signal, to thereby suction the electronic parts T using a predetermined suction force. Further, the valve drive section 64b generates a driving signal of the leak valve DV1 on the basis of an opening/closing command of the leak valve DV1 input from the control device 60, and outputs the driving signal to the leak valve DV1. The leak valve DV1 performs an opening/closing operation according to the input driving signal, to thereby transfer compressed air through a suction pad. The hand unit drive section 64, the hand motor MZ, the suction valve SV1 and the leak valve DV1 are installed to each of the supply hand unit 23 and the recovery hand unit 43, and the encoder EMZ is installed to each hand motor MZ. That is, the control device 60 controls an operation of the supply hand unit 23 and an operation of the recovery hand unit 43 in an independent manner.

Further, a shuttle drive section 65 which drives a shuttle motor MS to rotate is connected to the control device 60. An encoder EMS which detects the rotation position of the shuttle motor MS is connected to the shuttle drive section 65. The shuttle drive section 65 generates a driving current of the shuttle motor MS on the basis of a position command input from the control device 60 and the rotation position input from the encoder EMS, and outputs the driving current to the shuttle motor MS. The shuttle motor MS rotates according to the input driving current, to slide the shuttles 32 and 35 along the guides 32c and 35c. The shuttle drive section 65 and the shuttle motor MS are installed to each of the first shuttle 32 and the second shuttle 35, and the encoder EMS is installed to each shuttle motor MS. That is, the control device 60 controls an operation of the first shuttle 32 and an operation of the second shuttle 35 in an independent manner.

Further, a transport unit drive section 66 which includes a transport motor drive section 66a, a pressing motor driving section 66b and a suction valve drive section 66c is connected to the control device 60.

An encoder EMA which detects the rotation position of a transport motor MA is connected to the transport motor drive section 66a. The transport motor drive section 66a generates a driving current of the transport motor MA on the basis of a position command input from the control device 60 and the rotation position input from the encoder EMA, and outputs the driving current to the transport motor MA. The transport motor MA rotates according to the input driving current, to reciprocate the horizontal movement arm along the transport guide 31. The transport motor drive section 66a is installed to each of the first transport unit 34 and the second transport unit 36, and the encoder EMA is installed to each of the first transport unit 34 and the second transport unit 36.

An encoder EMB which detects the rotation position of the pressing motor MB is connected to the pressing motor drive section 66b. The pressing motor drive section 66b generates a driving current of the pressing motor MB on the basis of a position command input from the control device 60 and the rotation position input from the encoder EMB, and outputs the driving current to the pressing motor MB. The pressing motor MB rotates according to the input driving current, to move the vertical movement arm up and down. The pressing motor drive section 66b is installed to each of the first transport unit 34 and the second transport unit 36, and the encoder EMB is installed to each of the first transport unit 34 and the second transport unit 36.

A suction valve SV2 and a leak valve DV2 which are installed in each of the first hand 53 and the second hand 58 are connected to the valve drive section 66c. The valve drive section 66c generates a driving signal of the suction valve SV2 on the basis of an opening/closing command of the suction valve SV2 input from the control device 60, and outputs the driving signal to the suction valve SV2. Further, the suction valve SV2 performs an opening/closing operation according to the input driving signal, to thereby suction the electronic parts T using a predetermined suction force. Further, the valve drive section 66c generates a driving signal of the leak valve DV2 on the basis of an opening/closing command of the leak valve DV2 input from the control device 60, and outputs the driving signal to the leak valve DV2. The leak valve DV2 performs an opening/closing operation according to the input driving signal, to thereby transfer compressed air through the adsorbing section of the hand. The suction valve SV2 and the leak valve DV2 are installed to each of the first transport unit 34 and the second transport unit 36, and the valve drive section 66c is installed to each of the first transport unit 34 and the second transport unit 36. That is, the control device 60 controls an operation of the first transport unit 34 and an operation of the second transport unit 36 in an independent manner.

Further, a tester 69 which is accommodated in the handler 10 is electrically connected to the control device 60. When the first hand 53 is disposed at the first inspection position and the second hand 58 is disposed at the second inspection position, the control device 60 outputs a signal indicating inspection starting to the tester 69. The tester 69 receives an inspection starting signal, and then, starts inspection of the electronic parts T. If the inspection ends, the tester 69 outputs the inspection result and a signal indicating inspection ending to the control device 60.

Operation State of Handler 10

Next, an operation state of the handler 10 having the above-described configuration will be described with reference to FIG. 4 to FIGS. 14A to 14D. Hereinafter, four different operation states will be described. In each operation state, a case where an index cycle time that is a period of time when inspection of the electronic parts T is performed in the tester 69 becomes minimum will be described. FIGS. 4, 7, 10 and 13 are timing charts respectively illustrating four different operation states, in which 1 scale in the horizontal axis indicates 0.2 seconds. Firstly, the following operation A to operation J among operations performed by the handler 10 will be described.

Supply Operation A

The supply hand unit 23 suctions the electronic parts T accommodated in the supply conveyor tray, and then moves to above the supply shuttle tray which is a supply target. Further, the supply hand unit 23 reciprocates the hand in the Z direction, and then supplies the electronic parts T to the supply shuttle tray. It takes 2.2 seconds for a supply operation A which includes such a series of operations. That is, if eight electronic parts T are transported by one-time supply operation A, the supply hand unit 23 can transport the electronic parts T on the supply conveyor tray to the supply shuttle tray, by maximum 13090 electronic parts per hour.

Supply Elevating Operation B

In the supply operation A, it takes 0.4 seconds for a supply elevating operation B which includes an operation in which the supply hand unit 23 descends and ascends in the Z direction to suction the electronic parts T of the supply conveyor tray and an operation in which the supply hand unit 23 descends and ascends in the Z direction to mount the electronic parts T on the supply shuttle tray.

Transport Operation C

It takes 0.5 seconds for a transport operation C which includes an operation in which the transport units 34 and 36 move the hands 53 and 58 from above the delivery position to above the inspection position, and an operation in which the transport units 34 and 36 move the hands 53 and 58 from above the inspection position to above the delivery position. At this time, the transport units 34 and 36 make two hands 53 and 58 close to each other toward above the opening portion 45 which is above the inspection position, and dispose two hands 53 and 58 in the respective inspection positions in a state of being arranged in parallel. Further, the transport units 34 and 36 ascend from the opening portion 45 from the state of being arranged in the respective inspection positions, and then move two hands 53 and 58 to move away from each other.

Hand Elevating Operation D

It takes 0.3 seconds for an elevating operation which includes an operation in which the transport units 34 and 36 move the hand above the delivery position down and up to suction the electronic parts T on the supply shuttle tray to the hand, and an operation in which the transport units 34 and 36 move the hand above the delivery position down and up to discharge the electronic parts on the recovery shuttle tray.

Shuttle Operation F

It takes 0.4 seconds for the respective shuttles 32 and 35 to move between the supply position and the recovery position.

Recovery Operation G

The recovery hand unit 43 suctions the electronic parts T on the recovery shuttle tray, and then moves to above the recovery conveyor tray. Further, the recovery hand unit 43 reciprocates the hand in the Z direction, and then moves to above the recovery shuttle tray in which the electronic parts T which are the next recovery targets are accommodated. It takes 2.2 seconds for the recovery hand unit 43 to perform the recovery operation G which includes the series of operations. That is, the number of the electronic parts T recovered by the one-time recovery operation G is 8, the recovery hand unit 43 can transport the electronic parts T on the recovery shuttle tray to the recovery conveyor tray, in a maximum of 13090 electronic parts T per hour.

Recovery Elevating Operation H

It takes 0.4 seconds for a recovery elevating operation H which includes an operation in which the recovery hand unit 43 descends and ascends in the Z direction to suction the electronic parts T on the recovery shuttle tray and an operation in which the recovery hand unit 43 descends and ascends in the Z direction to mount the electronic parts T on the recovery conveyor tray, in the recovery operation G.

Standby Operation J

While the first hand 53 reciprocates in the Z direction to suction the electronic parts T on the supply shuttle tray 32a, the recovery hand unit 43 does not recover the electronic parts T from the recovery shuttle tray 32b and is in standby. Further, while the second hand 58 reciprocates in the Z direction to suction the electronic parts T on the supply shuttle tray 35a, the recovery hand unit 43 does not also recover the electronic parts T from the recovery shuttle tray 35b and is in standby.

First Operation State

Next, a first operation state in the handler 10 will be described with reference to FIG. 4 to FIGS. 6A to 6D. In the first operation state, the respective shuttles 32 and 35 and the respective transport units 34 and 36 are operated so as to satisfy the following condition 1 to condition 5.

Condition 1: The transport operations C of the respective transport units 34 and 36 are synchronizing with each other.

Condition 2: Among the hand elevating operations D of the respective transport units 34 and 36, the hand elevating operations D with respect to the recovery shuttle tray are synchronizing with each other.

Condition 3: Among the hand elevating operations D of the respective transport units 34 and 36, the hand elevating operations D with respect to the supply shuttle tray are synchronizing with each other.

Condition 4: The shuttle operations F to the supply positions of the respective shuttles 32 and 35 are synchronizing with each other.

Condition 5: The shuttle operations F to the recovery positions of the respective shuttles 32 and 35 are synchronizing with each other.

Figure 4:
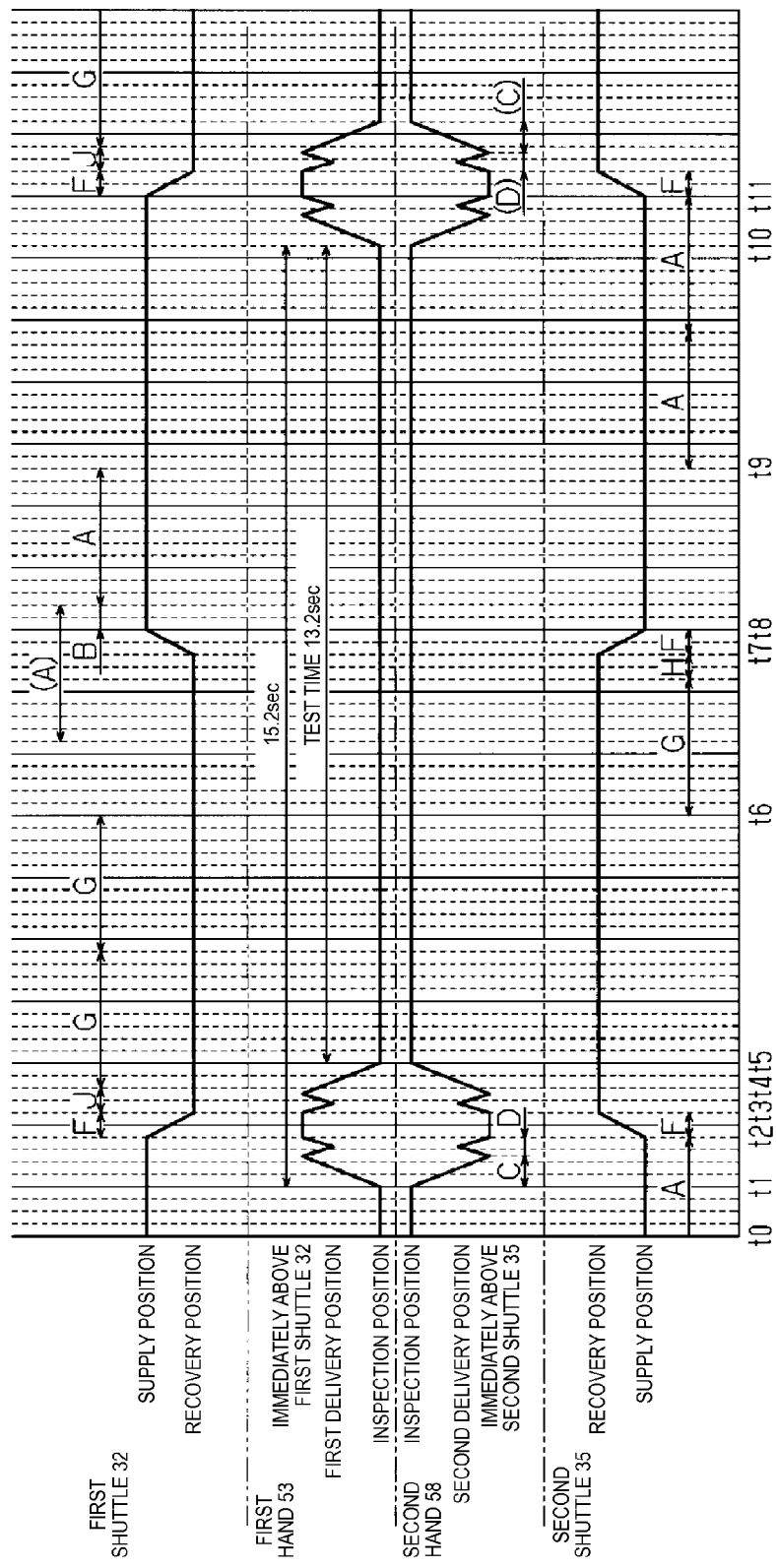
FIG. 4 is a timing chart illustrating a first operation state in the handler according to the embodiment.
Figure 5A:
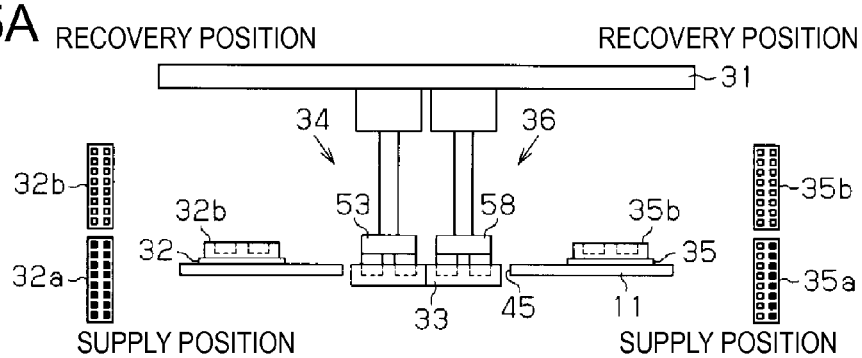
FIGS. 5A to 5D are end views illustrating arrangement of transport units in the first operation state.
Figure 5B:
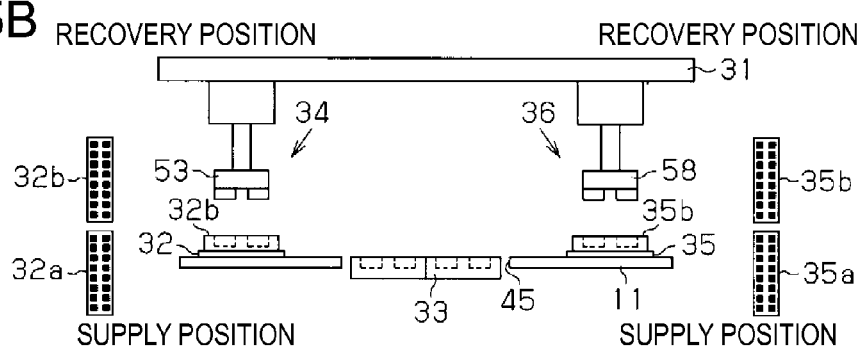

Firstly, at time t0 shown in FIG. 4, the respective shuttles 32 and 35 are disposed at the supply positions together, the respective hands 53 and 58 are disposed at the inspection positions, and the electronic parts T adhered to the respective hands 53 and 58 are inspected (see FIG. 5A). Further, if 0.8 seconds have elapsed from time t0, the inspection of the electronic parts T ends at time t1. If the inspection of the electronic parts T ends, the respective hands 53 and 58 move above from the inspection positions, perform the transport operation C so that the respective hands 53 and 58 move away from each other toward above the delivery positions, and then perform the hand elevating operation D with respect to the recovery shuttle tray (see FIG. 5B).

Figure 5C:
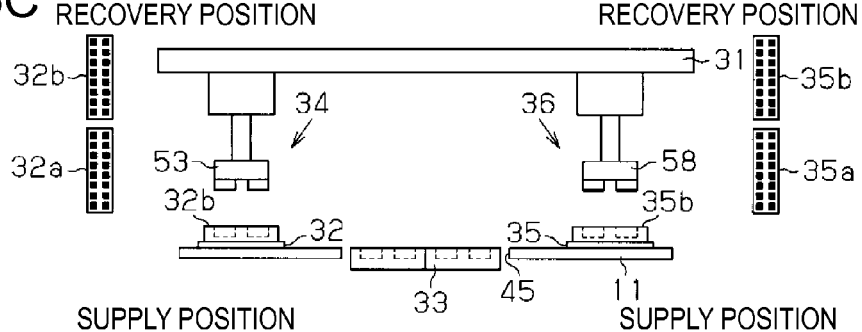

If the hand elevating operation D ends in the respective hands 53 and 58, at time t2, the respective shuttles 32 and 35 start the shuttle operation F to the recovery positions (see FIG. 5C). Then, if the respective shuttles 32 and 35 reach the recovery positions, the respective hands 53 and 58 start the hand elevating operation D with respect to the supply shuttle tray at time t3. Further, if the electronic parts T on the supply shuttle trays 32a and 35a are adhered to the respective hands 53 and 58, the respective hands 53 and 58 start the transport operation C so that the respective hands 53 and 58 are close to each other toward above the inspection positions at time t4.

During the period from time t3 to time t4, the respective shuttles 32 and 35 are disposed in the recovery positions, and the recovery hand unit 43 performs the standby operation J above the recovery shuttle tray 32b. If the standby operation J ends, the recovery hand unit 43 starts the recovery operation G with respect to the recovery shuttle tray 32b.

Figure 5D:
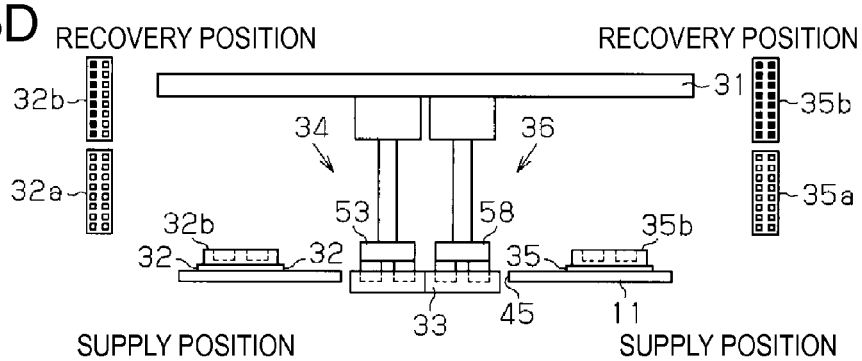
Figure 6A:
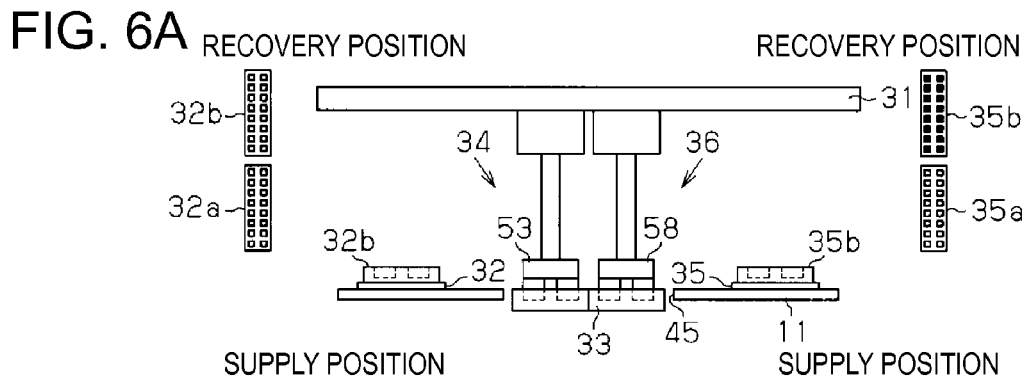
FIGS. 6A to 6D are end views illustrating arrangement of the transport units in the first operation state.

At this time, at time t5 when 0.8 seconds have elapsed from time t3, as shown in FIG. 5D, firstly, a part of the electronic parts T are recovered from the recovery shuttle tray 32b. Then, at time t6 when 4.4 seconds have elapsed from time t4, as shown in FIG. 6A, all the electronic parts T on the recovery shuttle tray 32b are recovered.

If the electronic parts T on the recovery shuttle tray 32b are recovered, the recovery hand unit 43 subsequently starts the recovery operation G with respect to the recovery shuttle tray 35b at time t6.

Figure 6B:
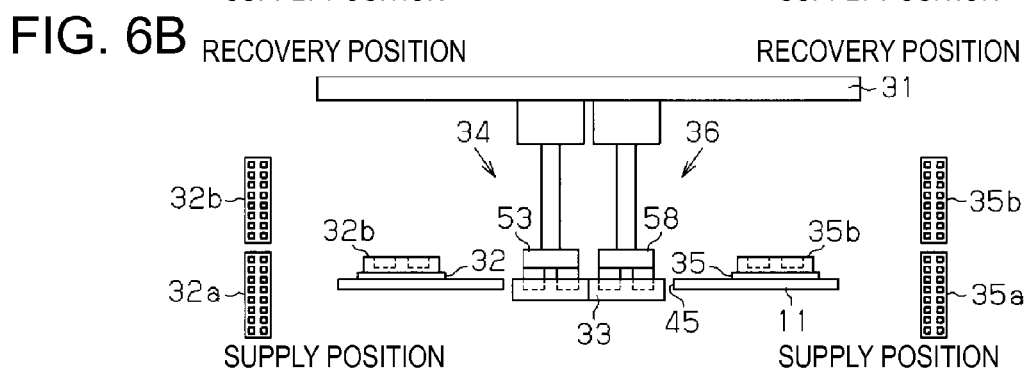

At this time, the recovery hand unit 43 firstly reciprocates once between the recovery shuttle tray 35b and the recovery conveyor tray C4a, and recovers a part of the electronic parts T on the recovery shuttle tray 35b in the recovery conveyor tray C4a. Then, in order to suction the remaining electronic parts T on the recovery shuttle tray 35b, the recovery hand unit 43 performs the recovery elevating operation H. Further, at time t7 when 2.6 seconds have elapsed from time t6, as shown in FIG. 6B, the recovery hand unit 43 recovers all the electronic parts T on the recovery shuttle tray 32b.

Figure 6C:
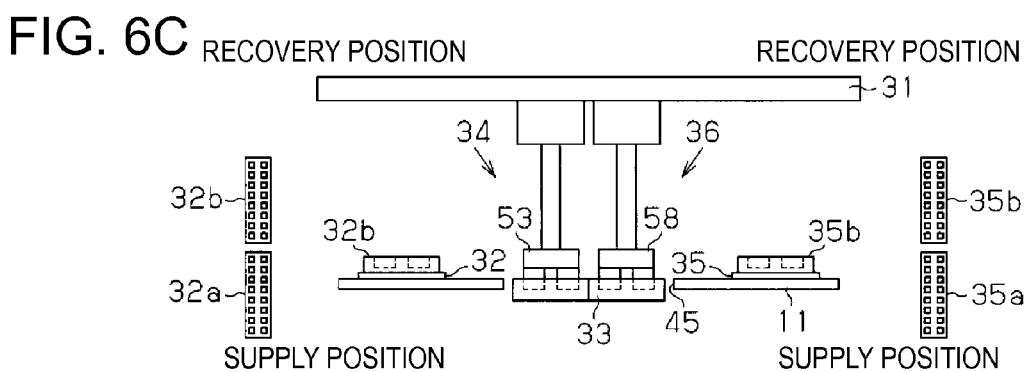
Figure 6D:
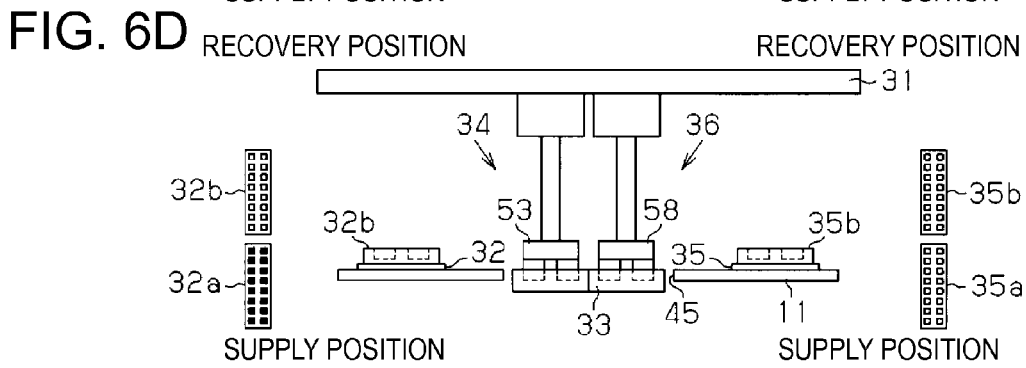

If the electronic parts T of the second shuttle 35 are recovered, the respective shuttles 32 and 35 perform the shuttle operation F to the supply positions from time t7 (see FIG. 6C). Then, if the shuttle operation F ends, the supply hand unit 23 performs the supply operation A from time t8 with respect to the supply shuttle tray 32a.

At this time, the supply hand unit 23 suctions the electronic parts T before inspection and waits above the first shuttle 32 from the time that precedes time t8 by 1.8 seconds so that the supply of the electronic parts T is started at time t8 when the first shuttle 32 is disposed in the supply position. Further, at time t8, the supply hand unit 23 starts the supply elevating operation B. Next, the supply hand unit 23 again reciprocates between the supply conveyor tray C1a and the supply shuttle tray 32a, and performs the supply operation A of supplying the remaining electronic parts T to the supply shuttle tray 32a (see FIG. 6D).

If the electronic parts T are supplied to the first shuttle 32, the supply hand unit 23 subsequently starts the supply operation A at time t9 with respect to the supply shuttle tray 35a.

At this time, the supply hand unit 23 reciprocates two times between the supply shuttle tray 35a of the second shuttle 35 and the supply conveyor tray C1a, and supplies the electronic parts T on the supply conveyor tray C1a to the supply shuttle tray 35a. Further, if the electronic parts T are supplied to the second shuttle 35, at time t11, the respective shuttles 32 and 35 enter a state which is equivalent to the state at the previous time t2.

Here, a time corresponding to time t1 with respect to the previous time t2 is time t10 with respect to time t11. In the first operation state, if time t10 is set as an inspection ending time, 15.2 seconds from time t1 to time t10 become an index cycle time, and 13.2 seconds from time t5 to time t10 become a test time. In other words, in the first operation state, if the test time of the electronic parts T is 13.2 seconds or shorter, the index cycle time of 15. 2 seconds is maintained. The number of treated electronic parts T per hour at this time is 3600 seconds÷15.2 seconds×32=236.8 . . . ×32≅236×32=7552.

On the other hand, in a handler having a configuration in which the electronic parts T held by the first hand 53 and the electronic parts T held by the second hand 58 are alternately disposed in the opening portion 45, if a switching time of the hands 53 and 58 is set to 0.4 seconds and a test time is set to 7.3 seconds, the number of treated electronic parts T per hour is 3600 seconds÷7.7 seconds×16= 467.5 . . . ×16≅467×16=7472. That is, if the test time of the electronic parts T is 7.3 seconds or longer, the handler 10 in the first operation state can inspect more electronic parts T.

Second Operation State

Next, a second operation state in the handler 10 will be described with reference to FIG. 7 to FIGS. 9A and 9B. In the second operation state, the respective shuttles 32 and 35 and the respective transport units 34 and 36 are operated so as to satisfy only the conditions 1 to 4 among the above-mentioned conditions.

Figure 7:
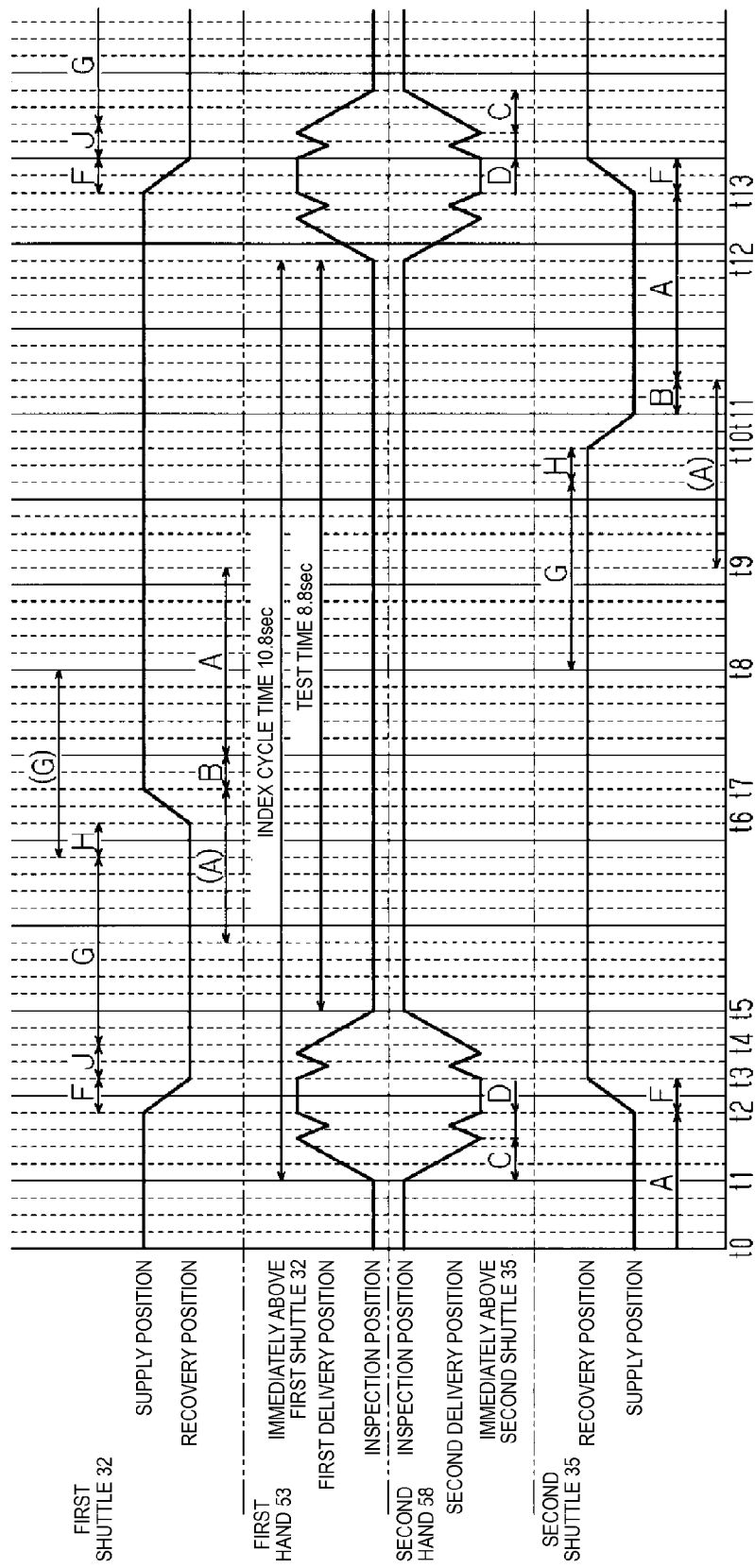
FIG. 7 is a timing chart illustrating a second operation state in the handler according to the embodiment.

In the second operation state, during a period from time t1 to time t5 in FIG. 7, the same operations as in the period from time t1 to time t5 in the first operation state are performed. Thus, in the second operation state, differences with the first operation state will be described in detail.

In a similar way to the first operation state, the recovery hand unit 43 starts the recovery operation G with respect to the recovery shuttle tray 32b at time t4.

Figure 8A:
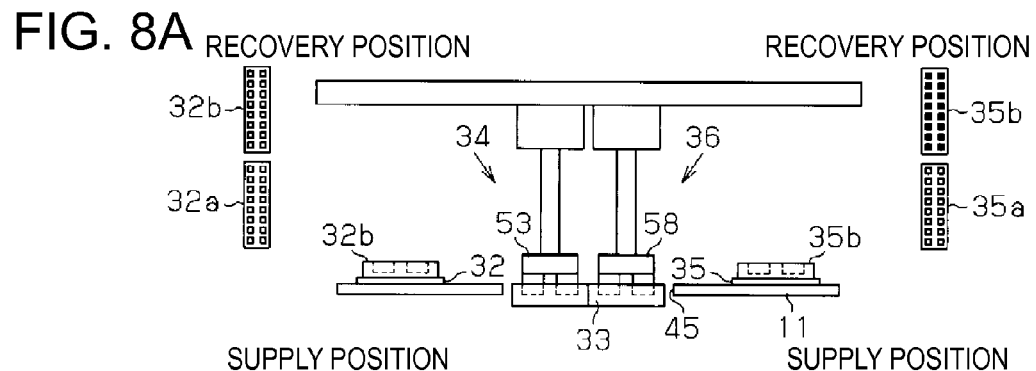
FIGS. 8A to 8D are end views illustrating arrangement of the transport units in the second operation state.
Figure 8B:
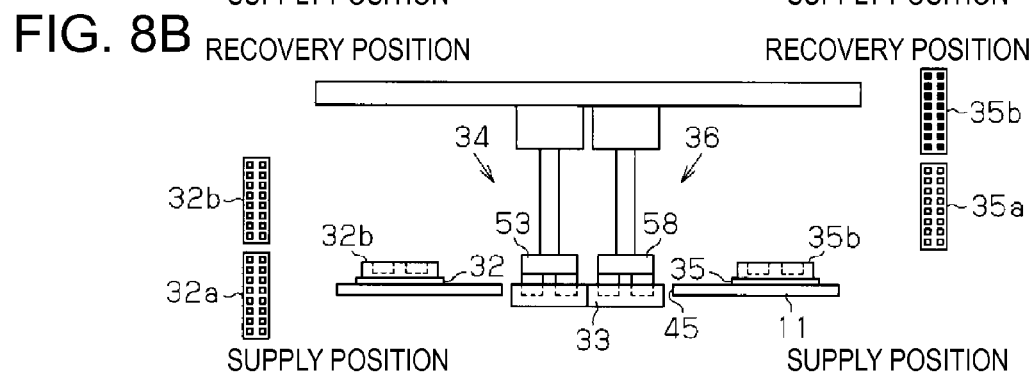
Figure 8C:
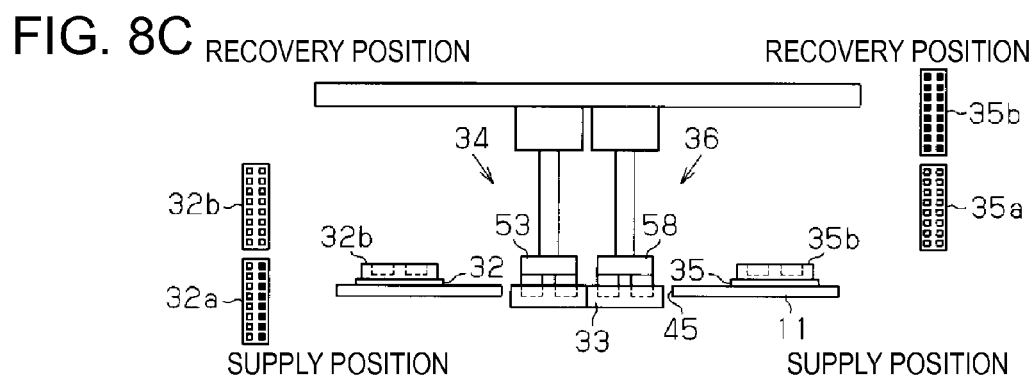
Figure 8D:
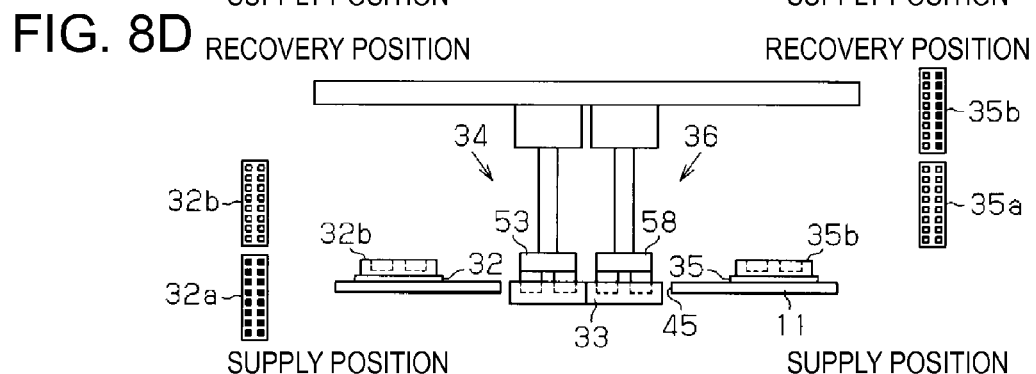

At this time, the recovery hand unit 43 reciprocates once between the recovery shuttle tray 32b and the recovery conveyor tray C3a, and recovers the electronic parts T on the recovery shuttle tray 32b onto the recovery conveyor tray C3a. Further, in order to suction the remaining electronic parts T on the recovery shuttle tray 35b, the recovery hand unit 43 performs the recovery elevating operation H, and then the first shuttle 32 moves to the supply position. Thus, at time t6 when 2.6 seconds have elapsed from time t4, as shown in FIG. 8A, all the electronic parts T on the recovery shuttle tray 32b are recovered. Further, at time t7 when 0.4 seconds have elapsed from time t6, as shown in FIG. 8B, the first shuttle 32 is disposed at the supply position.

If the first shuttle 32 is disposed at the supply position, the supply hand unit 23 starts the supply operation A with respect to the supply shuttle tray 32a, at time t7.

At this time, the supply hand unit 23 suctions the electronic parts T before inspection onto the supply hand unit 23 in advance and is in standby above the first shuttle 32 from the time that precedes time t7 by 1.8 seconds so that the electronic parts T are supplied at time t7 when the first shuttle 32 is disposed in the supply position. Further, at time t7, the supply hand unit 23 starts the supply elevating operation B.

Further, the supply hand unit 23 again reciprocates between the supply conveyor tray C1a and the supply shuttle tray 32a, and supplies the electronic parts T to the supply shuttle tray 32a. Thus, at time t9 when 2.6 seconds have elapsed from time t7, the electronic parts T are fully mounted on the supply shuttle tray 32a of the first shuttle 32.

On the other hand, at time t8 between time t7 and time t9, the recovery hand unit 43 starts the recovery operation G with respect to the recovery shuttle tray 35b.

Figure 9A:
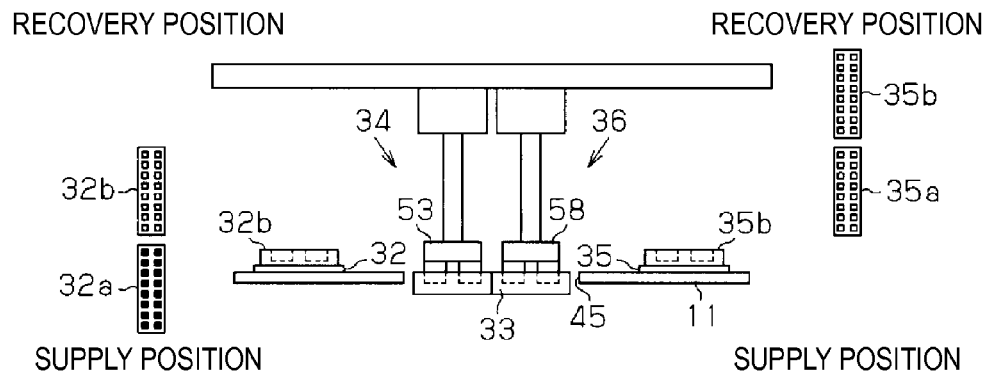
FIGS. 9A and 9B are end views illustrating arrangement of the transport units in the second operation state.

At this time, time t8 corresponds to a time when 1.8 seconds have elapsed from time t6 when the electronic parts T are recovered from the recovery shuttle tray 32b. Thus, the recovery hand unit 43 moves to above the recovery shuttle tray 35b in advance of time t8 (see FIG. 8C). Further, the recovery hand unit 43 reciprocates once between the recovery shuttle tray 35b of the second shuttle 35 and the recovery conveyor tray C4a from time t8, and recovers the electronic parts T on the recovery shuttle tray 35b onto the recovery conveyor tray C4a (see FIG. 8D). Then, in order to suction the remaining electronic parts T on the recovery shuttle tray 35b, the recovery hand unit 43 starts the recovery elevating operation H, and as shown in FIG. 9A, at time t10 when 2.6 seconds have elapsed from time t8, all the electronic parts T on the recovery shuttle tray 35b are recovered.

Figure 9B:
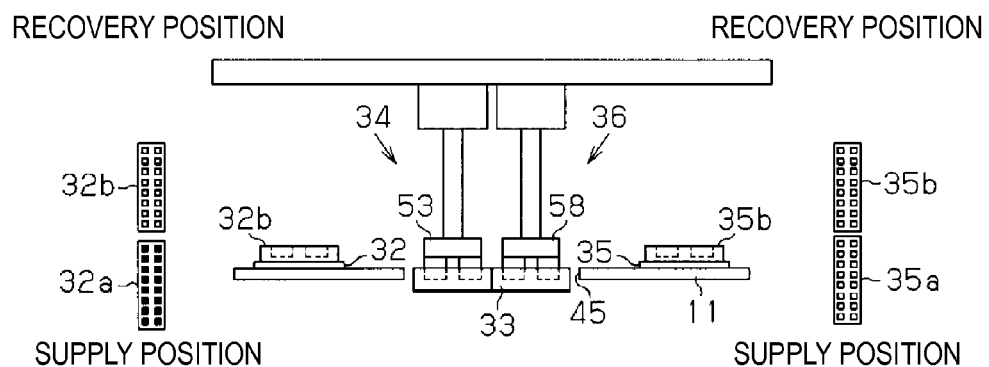

Further, if the electronic parts T are recovered from the recovery shuttle tray 35b, the second shuttle 35 performs the shuttle operation F to the supply position from time t10 (see FIG. 9B). Further, if the shuttle operation F ends, the supply hand unit 23 starts the supply operation A from time t11 with respect to the supply shuttle tray 35a.

At this time, the supply hand unit 23 suctions the electronic parts T before inspection and is in standby above the first shuttle 32 so that the electronic parts T start to be supplied at time t11 when the second shuttle 35 is disposed at the supply position. Further, at time t9 that precedes time t10 by 1.8 seconds, the electronic parts T are fully mounted on the supply shuttle tray 32a. Thus, the supply hand unit 23 continuously performs the supply of the electronic parts T to the first shuttle 32 and the supply of the electronic parts T to the second shuttle 35. Further, the supply hand unit 23 performs the supply elevating operation B with respect to the supply shuttle tray 35a, performs the supply operation A with respect to the supply shuttle tray 35a, and then supplies the remaining electronic parts T to the supply shuttle tray 35a. Thus, at time t13, the respective shuttles 32 and 35 enter a state which is equivalent to the state at the previous time t2.

Here, a time corresponding to time t1 with respect to the previous time t2 is time t12 with respect to time t13. In the second operation state, if time t12 is set as an inspection ending time, 10.8 seconds from time t1 to time t12 become an index cycle time, and 8.8 seconds from time t5 to time t12 become a test time. In other words, in the second operation state, if the test time of the electronic parts T is 8.8 seconds or shorter, the index cycle time of 10.8 seconds is maintained. The number of treated electronic parts T per hour at this time is 3600 seconds÷10.8 seconds×32= 333.3 . . . ×32≅333×32=10656.

On the other hand, in a handler having a configuration in which the electronic parts T held by the first hand 53 and the electronic parts T held by the second hand 58 are alternately disposed in the opening portion 45, if a switching time of the hands 53 and 58 is set to 0.4 seconds and a test time is set to 5.0 seconds, the number of treated electronic parts T per hour is 3600 seconds÷5.4 seconds×16= 666.6 . . . ×16≅666×16=10656. That is, if the test time of the electronic parts T exceeds 5.0 seconds, the handler 10 in the second operation state can inspect more electronic parts T.

Third Operation State

Next, a third operation state in the handler 10 will be described with reference to FIG. 10 to FIGS. 12A, 12B and 12C. In the third operation state, the respective shuttles 32 and 35 and the respective transport units 34 and 36 are operated so as to satisfy only the conditions 1 and 2 among the above-mentioned conditions.

Figure 10:
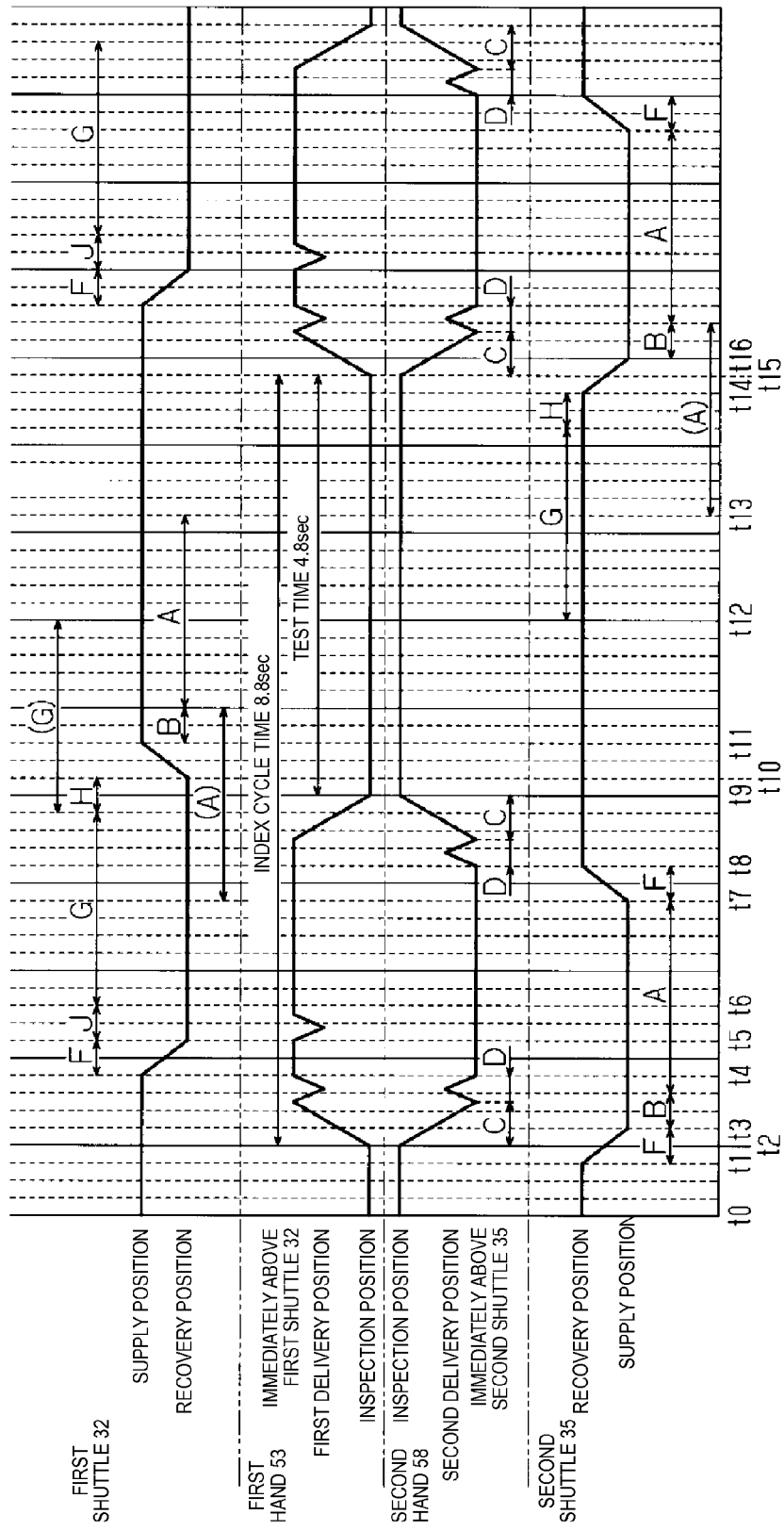
FIG. 10 is a timing chart illustrating a third operation state in the handler according to the embodiment.
Figure 11A:
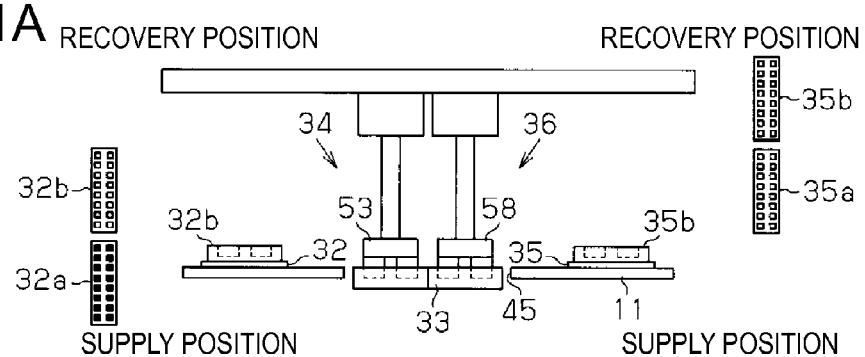
FIGS. 11A to 11D are end views illustrating arrangement of the transport units in the third operation state.
Figure 11B:
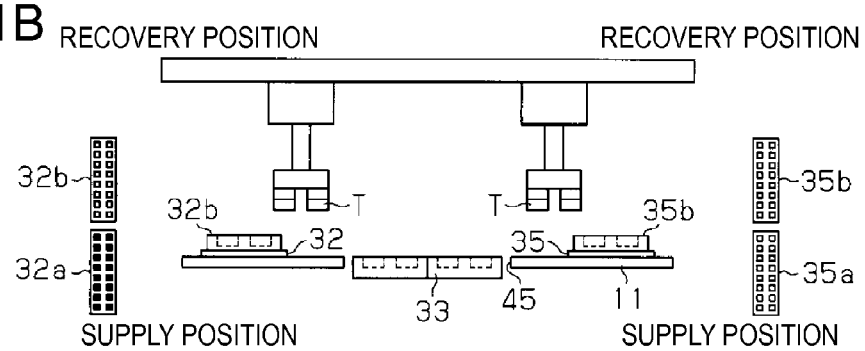
Figure 11C:
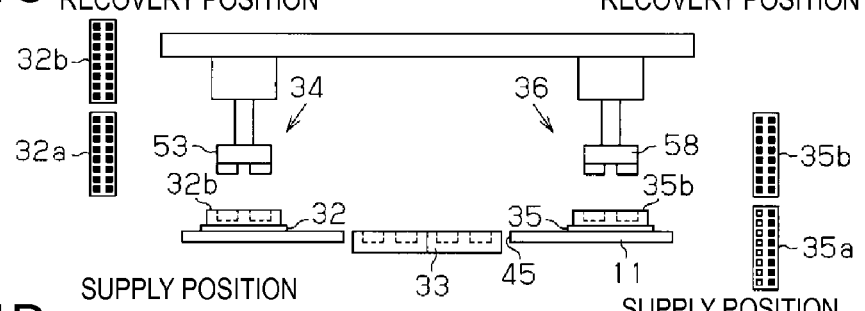
Figure 11D:
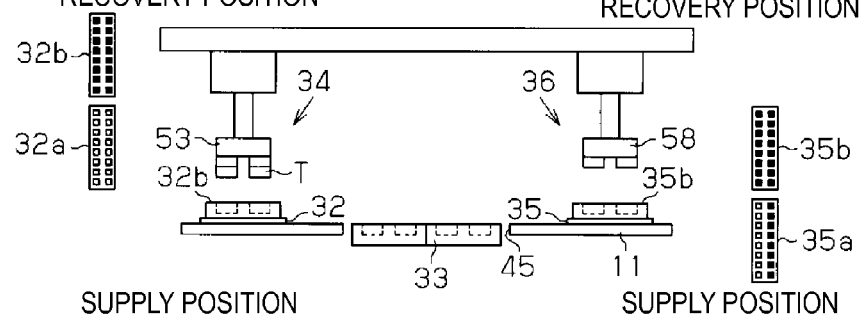

Firstly, at time t0 shown in FIG. 10, the first shuttle 32 is disposed at the supply position, the second shuttle 35 is disposed at the recovery position, the respective hands 53 and 58 are disposed at the inspection positions, and the electronic parts T adhered to the respective hands 53 and 58 are inspected (see FIG. 11A). Further, if 0.6 seconds have elapsed from time to, at time t1, the second shuttle 35 starts the shuttle operation F to the supply position.

If the second shuttle 35 reaches the supply position, at time t3, the supply hand unit 23 starts the supply operation A with respect to the supply shuttle tray 35a. At this time, the supply hand unit 23 suctions the electronic parts T before inspection and is in standby above the first shuttle 32 from the time that precedes time t3 by 1.8 seconds so that the supply of the electronic parts T starts at time t3 when the second shuttle 35 is disposed at the supply position. Further, at time t3, the supply hand unit 23 performs the supply elevating operation B, and then reciprocates between the supply conveyor tray C1a and the supply shuttle tray 35a to perform the supply operation A.

On the other hand, if 0.2 seconds have elapsed from time t1, at time t2, the inspection of the electronic parts T ends. If the inspection of the electronic parts T ends, the respective hands 53 and 58 move above from the inspection positions, perform the transport operation C so that the respective hands 53 and 58 move away from each other toward above the delivery positions, and then perform the hand elevating operation D with respect to the recovery shuttle tray (see FIG. 11B). Further, if 0.8 seconds have elapsed from time t2, the first shuttle 32 performs the shuttle operation F to the recovery position from time t4 (see FIG. 11C).

If the shuttle operation F to the recovery position of the first shuttle 32 ends, at time t5, the first hand 53 starts the hand elevating operation D with respect to the supply shuttle tray. Further, as the first hand 53 terminates the hand elevating operation D, the first hand 53 suctions the electronic parts T on the supply shuttle tray 32a at time t6 (see FIG. 11D). On the other hand, at time t6, the recovery hand unit 43 starts the recovery operation G with respect to the recovery shuttle tray 32b. During the time from time t5 to time t6, the recovery hand unit 43 performs the standby operation J above the recovery shuttle tray 32b.

At this time, the recovery hand unit 43 reciprocates once between the recovery shuttle tray 32b and the recovery conveyor tray C3a, and recovers a part of the electronic parts T on the recovery shuttle tray 32b onto the recovery conveyor tray C3a. Then, in order to suction the remaining electronic parts T on the recovery shuttle tray 32b, the recovery hand unit 43 performs the recovery elevating operation H.

Figure 12A:
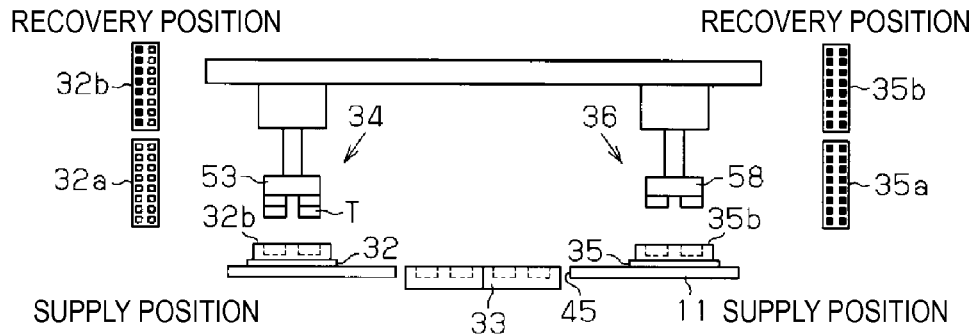
FIGS. 12A to 12C are end views illustrating arrangement of the transport units in the third operation state.

On the other hand, if the supply operation A ends with respect to the supply shuttle tray 35a, at time t7, the second shuttle 35 starts the shuttle operation F to the recovery position. Thus, at time t8 when 0.4 seconds have elapsed from time t7, as shown in FIG. 12A, in a state where the electronic parts T are fully mounted on the supply shuttle tray 35a, the second shuttle 35 is disposed at the recovery position and a part of the electronic parts T are recovered from the recovery shuttle tray 32b of the first shuttle 32. Further, the second hand 58 performs the hand elevating operation D with respect to the supply shuttle tray 35a at time t8. Further, the transport operation C is started so that the second hand 58 and the first hand 53 which already suctions the electronic parts T are close to each other toward above the respective inspection positions. Thus, at time t9 when 0.8 seconds have elapsed from time t8, the inspection of the electronic parts T is started.

Figure 12B:
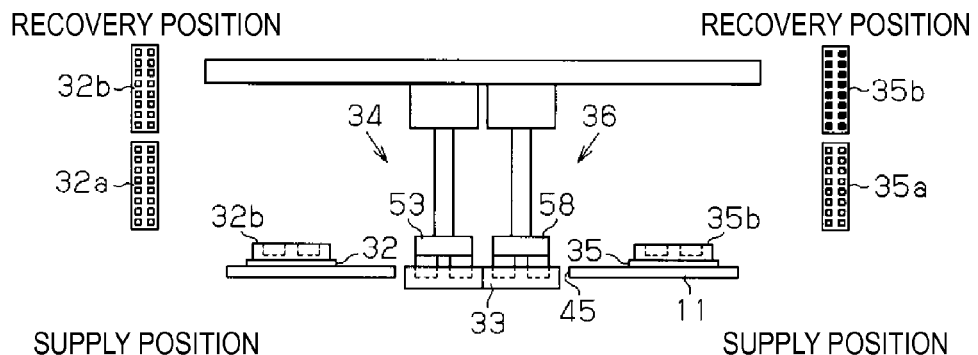
Figure 12C:
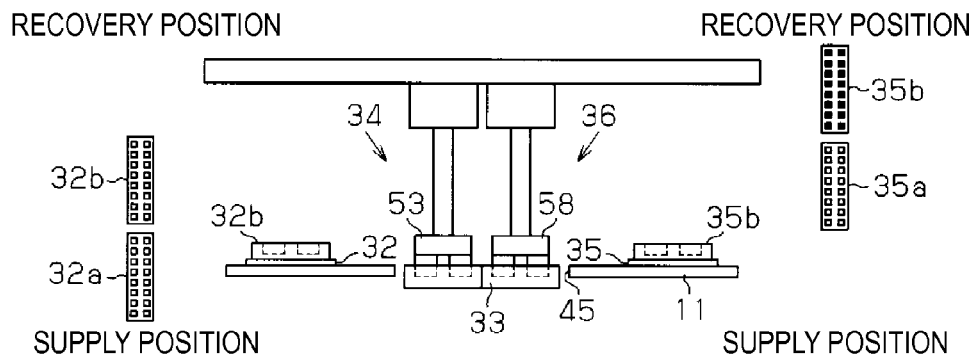
Figure 13:
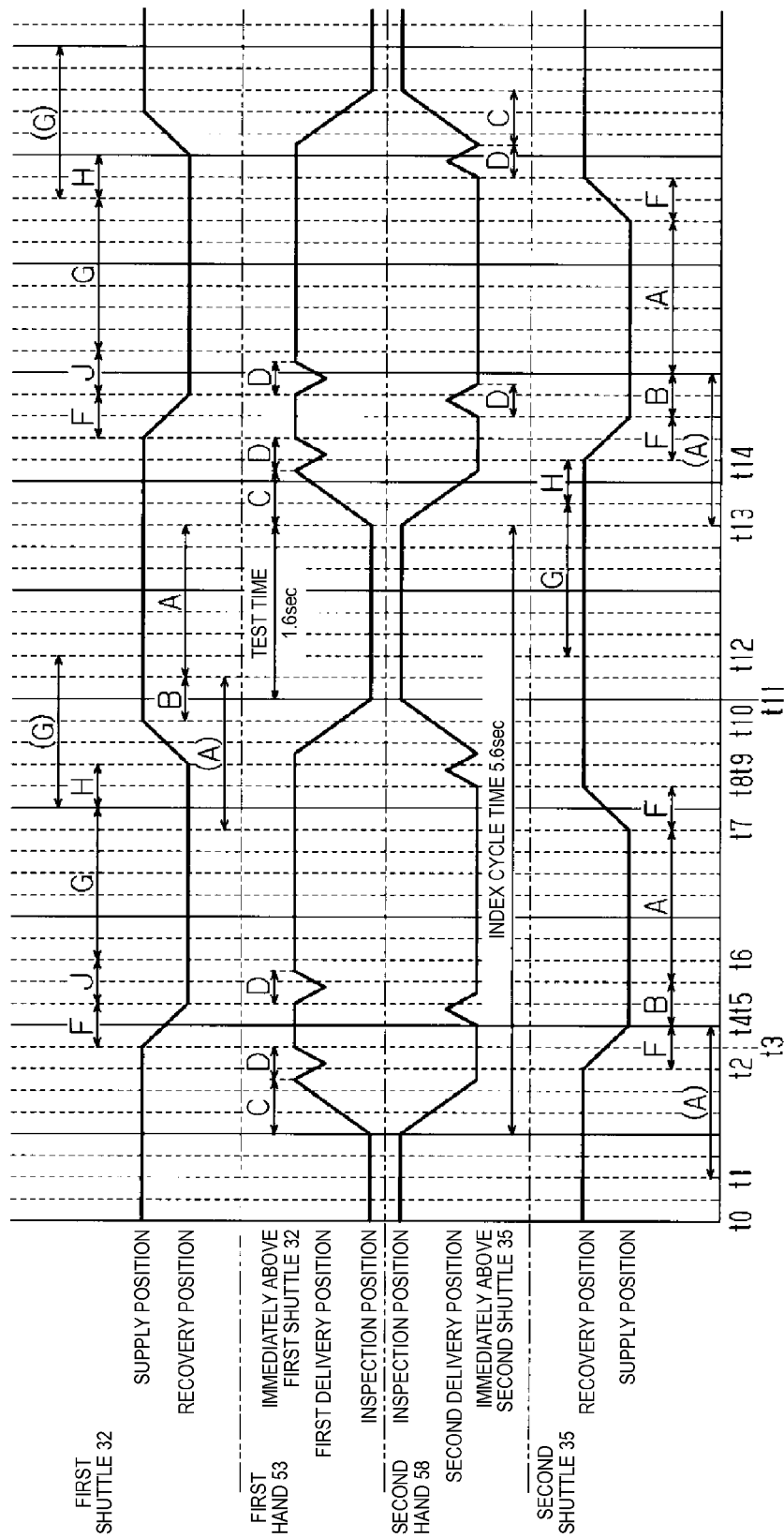
FIG. 13 is a timing chart illustrating a fourth operation state in the handler according to the embodiment.

If the inspection of the electronic parts T is started, at time t10, the respective hands 53 and 58 are disposed at the inspection positions, and all the electronic parts T are recovered from the recovery shuttle tray 32b (see FIG. 12B). Further, the first shuttle 32 starts the shuttle operation F to the supply position at time t10. Further, if 0.4 seconds have elapsed from time t10, the first shuttle 32 is disposed at the supply position at time t11 (see FIG. 12C).

If the first shuttle 32 is disposed at the supply position, the supply hand unit 23 starts the supply operation A with respect to the supply shuttle tray 32a. At this time, the supply hand unit 23 suctions the electronic parts T before inspection and is in standby above the first shuttle 32 from the time that precedes time t11 by 1.8 seconds so that the electronic parts T are supplied at time t11 when the first shuttle 32 is disposed at the supply position. Further, at time t11, the supply hand unit 23 starts the supply elevating operation B. Then, the supply hand unit 23 again reciprocates between the supply shuttle tray 32a and the supply conveyor tray C1a, and performs the supply operation A of supplying the remaining electronic parts T to the supply shuttle tray 32a until time t13.

Further, at time t12 between time t11 and time t13, the recovery hand unit 43 starts the recovery operation G with respect to the recovery shuttle tray 35$b$. The recovery hand unit 43 discharges the electronic parts T to the recovery conveyor tray C3$a$ from time t10 to time t12, and moves to above the recovery shuttle tray 35$b$.

At time t12, the recovery hand unit 43 reciprocates between the recovery shuttle tray 35$b$ and the recovery conveyor tray C4$a$, and recovers the electronic parts T on the recovery shuttle tray 35$b$. Further, in order to suction the remaining electronic parts T on the recovery shuttle tray 35$b$, the recovery hand unit 43 performs the recovery elevating operation H. That is, at time t14 when 2.6 seconds have elapsed from time t12, in a similar way to time t1 shown in FIG. 11A, the first shuttle 32 in which the supply of the electronic parts T with respect to the supply shuttle tray 32$a$ ends is disposed at the supply position. Further, the second shuttle 35 is disposed at the recovery position in a state where the supply shuttle tray 35$a$ and the recovery shuttle tray 35$b$ are empty.

The second shuttle 35 starts the shuttle operation F to the supply position at time t14. Further, the supply hand unit 23 starts the supply operation A with respect to the supply shuttle tray 35$a$ at time t16 when 0.4 seconds have elapsed from time t14.

At this time, the supply hand unit 23 suctions the electronic parts T before inspection and is in standby above the first shuttle 32 so that the electronic parts T start to be supplied at time t16 when the second shuttle 35 is disposed at the supply position. Further, at time t13 that precedes time t16 by 1.8 seconds, the electronic parts T are fully mounted on the supply shuttle tray 32$a$. Thus, the supply hand unit 23 continuously performs the supply of the electronic parts T to the first shuttle 32 and the supply of the electronic parts T to the second shuttle 35. Further, the supply hand unit 23 performs the supply elevating operation B with respect to the supply shuttle tray 35$a$, performs the supply operation A with respect to the supply shuttle tray 35$a$, and then supplies the remaining electronic parts T to the supply shuttle tray 35$a$. Thus, at time t16, the respective shuttles 32 and 35 enter a state which is equivalent to the state at the previous time t3.

Here, a time corresponding to time t2 with respect to the previous time t3 is time t15 with respect to time t16. If time t15 is set as an inspection ending time, 8.8 seconds from time t2 to time t15 become an index cycle time, and 4.8 seconds from time t9 to time t15 become a test time. In other words, in the third operation state, if the test time of the electronic parts T is 4.8 seconds or shorter, the index cycle time of 8.8 seconds is maintained. The number of treated electronic parts T per hour at this time is 3600 seconds÷8.8 seconds×32= 409.0 . . . × 32≅409×32=13088.

On the other hand, in a handler having a configuration in which the electronic parts T held by the first hand 53 and the electronic parts T held by the second hand 58 are alternately disposed in the opening portion 45, if a switching time of the hands 53 and 58 is set to 0.4 seconds and a test time is set to 4.0 seconds, the number of treated electronic parts T per hour is 3600 seconds÷4.4 seconds×16= 818.1 . . . ×16≅818×16=13088. That is, if the test time of the electronic parts T exceeds 4.0 seconds, the handler 10 in the third operation state can inspect more electronic parts T.

Fourth Operation State

Next, a fourth operation state in the handler 10 will be described with reference to FIG. 13 to FIGS. 14A, 14B, 14C and 14D. In the fourth operation state, the times taken for the supply operation A and the recovery operation G are different from each other, compared with the other operation states. That is, it takes 1 second and 4 seconds for the supply operation A and the recovery operation G, respectively. Further, in the fourth operation state, the respective shuttles 32 and 35 and the respective transport units 34 and 36 are operated so as to satisfy only the condition 1 among the above-mentioned conditions.

Figure 14A:
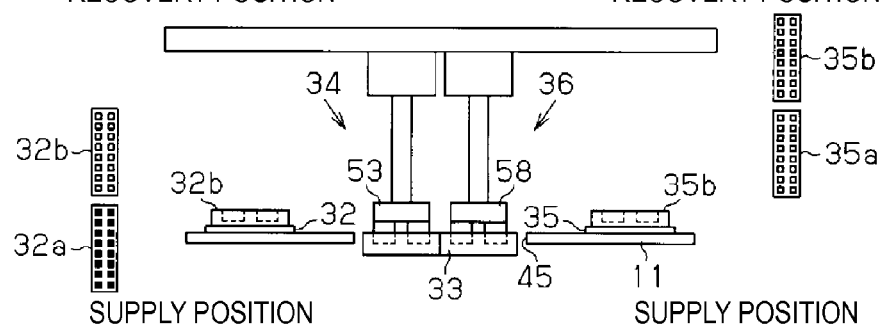
FIGS. 14A to 14D are end views illustrating arrangement of the transport units in the fourth operation state.
Figure 14B:
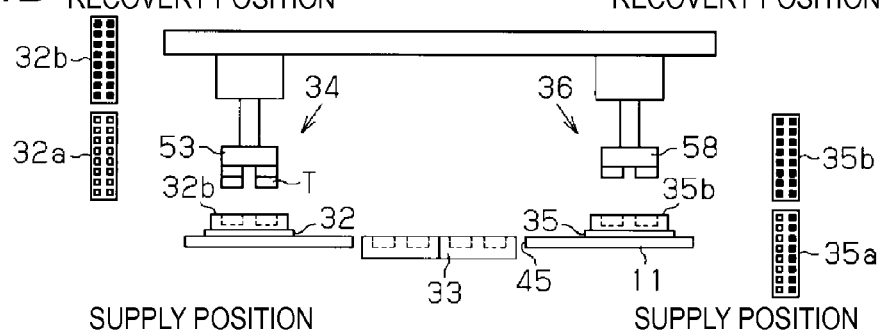

In the fourth operation state, the inspection of the electronic parts T ends at time t1. The handler 10 at time t1 is in the same state as in time t0 in the third operation state with respect to the respective shuttles 32 and 35. Thus, time t1 in the fourth operation state is shown in FIG. 14A, and detailed description will be omitted.

If the inspection of the electronic parts T ends at time t1, the respective hands 53 and 58 move above from the inspection positions and perform the transport operation C so that the respective hands 53 and 58 move away from each other toward above the delivery positions, and then, only the first hand 53 performs the hand elevating operation D with respect to the recovery shuttle tray 32$b$.

At time t2 when 0.6 seconds have elapsed from time t1, the second shuttle 35 starts the shuttle operation F to the supply position. Further, at time t4 when 0.4 seconds have elapsed from time t2, the second hand 58 performs the hand elevating operation D with respect to the recovery shuttle tray 35$b$. Further, at time t4, the supply hand unit 23 starts the supply operation A with respect to the supply shuttle tray 35$a$.

At this time, the supply hand unit 23 suctions the electronic parts T before inspection and is in standby above the second shuttle 35 so that the electronic parts T are supplied at time t4 when the second shuttle 35 is disposed at the supply position, from time t1 that precedes time t4 by 1.0 seconds. Further, at time t4, the supply hand unit 23 performs the supply elevating operation B, and then reciprocates between the supply conveyor tray C1$a$ and the supply shuttle tray 35$a$ to perform the supply operation A.

On the other hand, at time t3 when 0.8 seconds have elapsed from time t1, the first shuttle 32 starts the shuttle operation F to the recovery position. Further, at time t5 when 0.4 seconds have elapsed from time t3, the first hand 53 performs the hand elevating operation D with respect to the supply shuttle tray 32$a$.

Further, the recovery hand unit 43 starts the recovery operation G with respect to the recovery shuttle tray 32$b$ at time t6 when 0.4 seconds have elapsed from time t5. During the time from time t5 to time t6, the recovery hand unit 43 performs the standby operation J above the recovery shuttle tray 32$b$. Further, at time t6, the recovery hand unit 43 reciprocates once between the recovery shuttle tray 32$b$ and the recovery conveyor tray C3$a$ to perform the recovery operation G (see FIG. 14B). Then, in order to suction the remaining electronic parts T on the recovery shuttle tray 32$b$, the recovery hand unit 43 performs the recovery elevating operation H. That is, at time t9 when 1.8 seconds have elapsed from time t6, all the electronic parts T are recovered from the recovery shuttle tray 32$b$.

The first shuttle 32 starts the shuttle operation F to the supply position at time t9. The supply hand unit 23 starts the supply operation A with respect to the supply shuttle tray 32$a$ at time t10 when 0.4 seconds have elapsed from time t9.

At this time, the supply hand unit 23 suctions the electronic parts T before inspection and is in standby above the first shuttle 32 so that the electronic parts T are supplied at time t10 when the first shuttle 32 is disposed at the supply position, from time t7 that precedes time t10 by 1.0 seconds. Further, at time t10, the supply hand unit 23 starts the supply elevating operation B with respect to the supply shuttle tray 32$a$. Then, the supply hand unit 23 again reciprocates between the supply shuttle tray 32a and the supply conveyor tray C1a, and performs the supply operation A of supplying the remaining electronic parts T to the supply shuttle tray 32a. That is, at time t13 when 1.8 seconds have elapsed from time t10, the electronic parts T are fully mounted on the supply shuttle tray 35a.

Figure 14C:
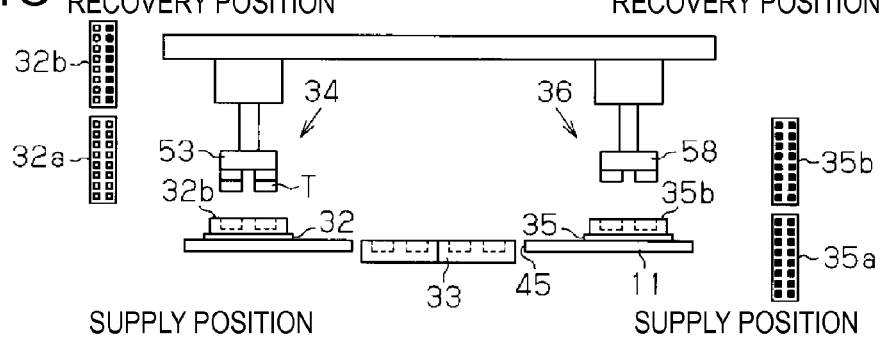
Figure 14D:
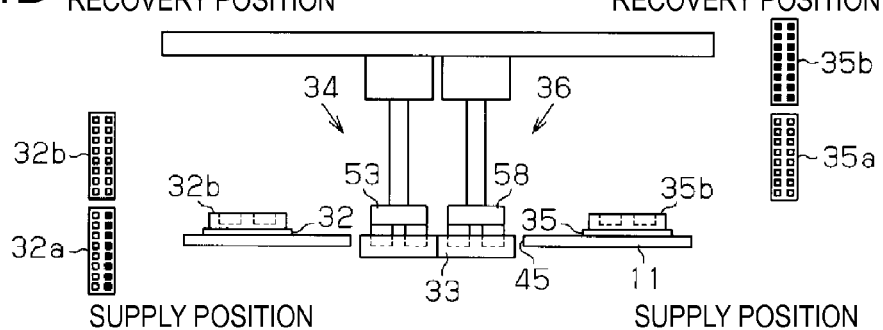

On the other hand, the second shuttle 35 starts the shuttle operation F to the recovery position at time t7. That is, the second shuttle 35 starts the shuttle operation F to the recovery position in a state where the electronic parts T are supplied to the supply shuttle tray 35a, as shown in FIG. 14C. Further, at time t8 when 0.4 seconds have elapsed from time t7, the second hand 58 performs the supply elevating operation B with respect to the supply shuttle tray 35a, and then, the respective hands 53 and 58 perform the transport operation C so that the hands 53 and 58 are close to each other toward above the respective inspection positions. That is, as shown in FIG. 14D, at time t11 when 0.8 seconds have elapsed from time t8, the respective hands 53 and 58 are disposed at the inspection positions, and apart of electronic parts T are supplied to the supply shuttle tray 32a of the first shuttle 32.

The recovery hand unit 43 starts the recovery operation G with respect to the recovery shuttle tray 35b at time t12 when 0.4 seconds have elapsed from time t11. The recovery hand unit 43 ejects the recovered electronic parts T to the recovery conveyor tray C3a from time t9 to time t12, and moves to above the recovery shuttle tray 35b. Further, the recovery hand unit 43 reciprocates between the recovery shuttle tray 35b and the recovery conveyor tray C4a at time t12 to perform the recovery operation G. Then, the recovery hand unit 43 performs the recovery elevating operation H so as to suction the remaining electronic parts T on the recovery shuttle tray 35b. That is, at time t14 when 1.8 seconds have elapsed from time t12, all the electronic parts T are recovered from the recovery shuttle tray 35b of the second shuttle 35. Thus, at time t14, the respective shuttles 32 and 35 enter a state which is equivalent to the state at the previous time t2.

Here, a time corresponding to time t1 with respect to the previous time t2 is time t13 with respect to time t14. If time t13 is set as an inspection ending time, 5.6 seconds from time t1 to time t13 become an index cycle time, and 1.6 seconds from time t11 to time t13 become a test time. In other words, if the test time of the electronic parts T is 1.6 seconds or shorter, the index cycle time of 5.6 seconds is maintained. The number of treated electronic parts T per hour at this time is 3600 seconds÷5.6 seconds×32= 642.8 . . . ×32≅642×32=20544.

On the other hand, in a handler having a configuration in which the electronic parts T held by the first hand 53 and the electronic parts T held by the second hand 58 are alternately disposed in the opening portion 45, if the test time is set to 1.6 seconds, since the test time is too short, only the amount according to the transport capabilities of the supply hand unit 23 and the recovery hand unit 43 is treated. That is, if the test time of the electronic parts T is 1.6 seconds or shorter, the handler 10 in the fourth operation state can inspect more electronic parts T.

As described above, according to the present embodiment, it is possible to achieve the following effects.

(1) The opening portion 45 in which the first hand 53 and the second hand 58 can be disposed in parallel is formed on the base 11. Thus, the electronic parts T of the first hand 53 and the electronic parts T of the second hand 58 are inserted in parallel into the test head 33. That is, in the handler 10 which includes two hands, it is possible to inspect the greatest number of electronic parts T at the same period. As a result, unlike a handler having a configuration in which only the electronic parts T held by one of the hands 53 and 58 are inserted into the test head 33, it is not necessary to increase the sizes of the hands 53 and 58 in order to increase the number of electronic parts T which are disposed in the opening portion 45 at the same period. That is, the increasing size of the apparatus is suppressed, and the number of electronic parts T capable of being held by the hands 53 and 58 is maintained, and thus, it is possible to increase the number of electronic parts T disposed in the opening portion 45. Thus, decrease in the transport speed or increase in the transport distance due to the increasing size of the hand is suppressed, and thus, it is possible to increase the number of electronic parts T transported to the opening portion 45 and to efficiently transport the electronic parts T.

(2) Since the suction and ejection of the electronic parts T using the first hand 53 are performed at the same first delivery position, compared with the configuration in which the suction and ejection are performed at different positions, it is possible to suppress a movement path of the first hand 53 and a mechanism which moves the first hand 53 from being complicated. Similarly, since the suction and ejection of the electronic parts T using the second hand 58 are performed at the same second delivery position, compared with the configuration in which the suction and ejection are performed at different positions, it is possible to suppress a movement path of the second hand 58 and a mechanism which moves the second hand 58 from being complicated. Thus, it is possible to suppress the increasing size of the handler 10.

(3) Since the transport motors which move the first hand 53 and the second hand 58 along the transport guide 31 are different from each other, it is possible to dispose the respective hands 53 and 58 at the positions which face the opening portion 45 in the Z direction, at the time same time or at different times.

(4) In the first shuttle 32, the supply shuttle tray 32a in which the electronic parts T before inspection are accommodated and the recovery shuttle tray 35b in which the electronic parts T after inspection are accommodated are different from each other, and any one of them is disposed at the first delivery position. Thus, in a case where the recovery shuttle tray 32b is disposed at the first delivery position, it is possible to supply the electronic parts T to the supply shuttle tray 32a.

On the other hand, in a case where the supply shuttle tray 32a is disposed at the first delivery position, it is possible to recover the electronic parts T ejected to the recovery shuttle tray 32b. This is similarly applied to the second shuttle 35.

That is, it is possible to smoothly perform suction and ejection of the electronic parts T using the respective hands 53 and 58.

(5) The electronic parts T before inspection are supplied to the supply shuttle trays 32a and 35a of the respective shuttle and 35 using the supply hand unit 23. Further, the electronic parts T after inspection are recovered from the recovery shuttle trays 32b and 35b of the respective shuttle 32 and 35 using the recovery hand unit 43. According to this configuration, compared with a configuration in which the supply hand unit 23 and the recovery hand unit 43 are installed so as to correspond to the respective shuttle 32 and 35, it is possible to suppress the increasing size of the handler.

(6) In the first and second operation states, since the ejection of the electronic parts T after inspection and the suction of the electronic parts T before inspection using the respective hands 53 and 58 can be performed in a short period of time, it is possible to maintain the index cycle time even in the electronic parts T having a long test time compared with the other operation states.

(7) In the second, third and fourth operation states, at least one time of the times when the respective shuttle 32 and 35 are disposed at the supply positions and the times when the respective shuttles 32 and 35 are disposed at the recovery positions is different from the other times. According to this configuration, for example, it is possible to perform supply of the electronic parts T with respect to the first shuttle 32 using the supply hand unit 23 and recovery of the electronic parts T with respect to the second shuttle 35 using the recovery hand unit 43 at the same time. Thus, it is possible to decrease the index cycle time, compared with the first operation state.

(8) In the third and fourth operation states, at least one time of the times when the respective hands 53 and 58 suction the electronic parts T and the times when the respective hands 53 and 58 eject the electronic parts T is different from the other times. According to this configuration, for example, it is possible to enhance the degree of freedom relating to the times when the electronic parts T are supplied to the respective shuttles and the times when the electronic parts T are recovered from the respective shuttles. Thus, it is possible to further decrease the index cycle time.

The above-described embodiment may be appropriately modified as follows.

The transport targets may be supplied to each of a plurality of supply trays using a plurality of supply hand units.

According to this configuration, it is possible to supply the transport targets at the same time with respect to each of the plurality of the supply trays.

The transport targets may be recovered from each of a plurality of recovery trays using a plurality of recovery hand units.

According to this configuration, it is possible to recover the transport targets at the same time with respect to each of the plurality of recovery trays.

A position where the transport targets are supplied to one hand and a position where the transport targets are recovered from the one hand may be different from each other. The transport motors which move two hands may be a common single motor. According to this configuration, it is easy to synchronize the operations of two hands.

Two hands lifted from the opening portion may be in a state of returning to the transport source at different times.

The part inspection apparatus is not limited to a configuration in which the tester and the handler are separately provided, and may have a configuration in which the tester and the handler are integrally provided.

The entire disclosure of Japanese Patent Application No. 2011-193666, filed Sep. 6, 2011 is expressly incorporated by reference herein.

What is claimed is:

1. A handler comprising:
a base having an opening portion;
a first transport section which includes a first hand which holds a transport target and moves the first hand toward the opening portion;
a second transport section which includes a second hand which holds the transport target and moves the second hand toward the opening portion;
a first shuttle in which a first supply tray which supplies the transport target to be held by the first hand to the first hand and a first recovery tray which recovers, from the first hand, the transport target discharged from the first hand are independently installed;
a second shuttle in which a second supply tray which supplies the transport target to be held by the second hand to the second hand and a second recovery tray which recovers, from the second hand, the transport target held by the second hand are independently installed; and
a control section which controls an operation of the first transport section and an operation of the second transport section,
wherein the handler has a state where the first hand and the second hand move in a horizontal direction from a position where the first hand and the second hand are spaced from each other to a position where the first hand and the second hand face the opening portion in different directions and then move toward the opening portion in a vertical direction so that the first hand and the second hand are adjacently disposed in the opening portion,
wherein the first transport section moves the first hand between a first position where the first hand is disposed in the opening portion and a first delivery position where holding and discharge of the transport target by the first hand are performed,
wherein the second transport section moves the second hand between a second position where the second hand is disposed in the opening portion and a second delivery position where holding and discharge of the transport target by the second hand are performed,
wherein the handler has a state where the first hand disposed at the first position and the second hand disposed at the second position move to detach from the opening portion and then move toward the respective delivery positions in different directions, and
wherein the control section controls an operation of the first shuttle and an operation of the second shuttle, and switches a tray disposed at the first delivery position alternately between the first supply tray and the first recovery tray and switches a tray disposed at the second delivery position alternately between the second supply tray and the second recovery tray.

2. The handler according to claim 1,
wherein the handler has a state where the first supply tray is disposed at the first delivery position and the second supply tray is disposed at the second delivery position.

3. The handler according to claim 1,
wherein the handler has a state where the first recovery tray is disposed at the first delivery position and the second recovery tray is disposed at the second delivery position.

4. The handler according to claim 1,
wherein the control section controls the operation of the first shuttle and the operation of the second shuttle so that a disposition of the first supply tray to the first delivery position and a disposition of the second supply tray to the second delivery position are performed at the same timing, and controls the operation of the first shuttle and the operation of the second shuttle so that the disposition of the first recovery tray to the first delivery position and the disposition of the second supply tray to the second delivery position are performed at the same timing.

5. The handler according to claim 4,
wherein the control section controls the operation of the first transport section and the operation of the second transport section so that the holding of the transport target by the first hand and the holding of the transport target by the second hand are performed at the same timing, and controls the operation of the first transport section and the operation of the second transport section so that the discharge of the transport target by the first hand and the holding of the transport target by the second hand are performed at the same timing.

6. A part inspection apparatus comprising
a tester which inspects an electronic part, and
a handler where the tester is mounted and which presses the electronic part against an inspection socket of the tester,
wherein the handler includes:
  a base having an opening portion;
  a first transport section which includes a first hand which holds a transport target and moves the first hand toward the opening portion;
  a second transport section which includes a second hand which holds the transport target and moves the second hand toward the opening portion;
  a first shuttle in which a first supply tray which supplies the transport target to be held by the first hand to the first hand and a first recovery tray which recovers, from the first hand, the transport target discharged from the first hand are independently installed;
  a second shuttle in which a second supply tray which supplies the transport target to be held by the second hand to the second hand and a second recovery tray which recovers, from the second hand, the transport target held by the second hand are independently installed; and
  a control section which controls an operation of the first transport section and an operation of the second transport section,
wherein the handler has a state where the first hand and the second hand move in a horizontal direction from a position where the first hand and the second hand are spaced from each other to a position where the first hand and the second hand face the opening portion in different directions and then move toward the opening portion in a vertical direction so that the first hand and the second hand are adjacently disposed in the opening portion,
wherein the first transport section moves the first hand between a first position where the first hand is disposed in the opening portion and a first delivery position where holding and discharge of the transport target by the first hand are performed,
wherein the second transport section moves the second hand between a second position where the second hand is disposed in the opening portion and a second delivery position where holding and discharge of the transport target by the second hand are performed,
wherein the handler has a state where the first hand disposed at the first position and the second hand disposed at the second position move to detach from the opening portion and then move toward the respective delivery positions in different directions, and
wherein the control section controls an operation of the first shuttle and an operation of the second shuttle, and switches a tray disposed at the first delivery position alternately between the first supply tray and the first recovery tray and switches a tray disposed at the second delivery position alternately between the second supply tray and the second recovery tray.

* * * * *